(12) United States Patent
Inoue et al.

(10) Patent No.: US 8,962,077 B2
(45) Date of Patent: Feb. 24, 2015

(54) VAPOR DEPOSITION PARTICLE EMITTING DEVICE, VAPOR DEPOSITION APPARATUS, VAPOR DEPOSITION METHOD

(75) Inventors: Satoshi Inoue, Osaka (JP); Shinichi Kawato, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 16 days.

(21) Appl. No.: 14/004,894

(22) PCT Filed: Mar. 7, 2012

(86) PCT No.: PCT/JP2012/055800
§ 371 (c)(1),
(2), (4) Date: Sep. 12, 2013

(87) PCT Pub. No.: WO2012/124563
PCT Pub. Date: Sep. 20, 2012

(65) Prior Publication Data
US 2014/0010957 A1  Jan. 9, 2014

(30) Foreign Application Priority Data
Mar. 14, 2011  (JP) ................................ 2011-055963

(51) Int. Cl.
*C23C 16/448* (2006.01)
*C23C 14/04* (2006.01)
*C23C 14/24* (2006.01)
*H01L 51/00* (2006.01)
*H01L 51/56* (2006.01)

(52) U.S. Cl.
CPC ............. *C23C 16/448* (2013.01); *C23C 14/042* (2013.01); *C23C 14/243* (2013.01); *H01L 51/0003* (2013.01); *H01L 51/56* (2013.01)
USPC .......................... 427/248.1; 118/715; 118/726

(58) Field of Classification Search
None
See application file for complete search history.

(56) References Cited

U.S. PATENT DOCUMENTS
2003/0015140 A1 *  1/2003  Van Slyke et al. ...... 118/723 VE

FOREIGN PATENT DOCUMENTS
JP  2008-223102 A  9/2008

OTHER PUBLICATIONS

International Search Report received for PCT Patent Application No. PCT/JP2012/055800, mailed on Jun. 19, 2012, 4 pages. (2 pages of English Translation and 2 pages of ISR).

* cited by examiner

*Primary Examiner* — Joseph Miller, Jr.
(74) *Attorney, Agent, or Firm* — Morrison & Foerster LLP

(57) ABSTRACT

A vapor deposition particle emitting device (30) includes a hollow rotor (40) provided with a first and a second nozzle sections (50 and 60), a rolling mechanism, and heat exchangers (52 and 62), and when the rolling mechanism causes the rotor (40) to rotate, the heat exchangers (52 and 62) switch between cooling and heating in accordance with placement of the nozzle section so that that one of the nozzle sections which faces outward has a temperature lower than a temperature at which vapor deposition material turns into gas and the other nozzle section has a temperature equal to or higher than the temperature at which the vapor deposition material turns into the gas.

**

US 8,962,077 B2

VAPOR DEPOSITION PARTICLE EMITTING DEVICE, VAPOR DEPOSITION APPARATUS, VAPOR DEPOSITION METHOD

CROSS REFERENCE TO RELATED APPLICATIONS

This is a U.S. National Phase patent application of PCT/JP2012/055800, filed Mar. 7, 2012, which claims priority to Japanese patent application no. 2011-055963, filed Mar. 14, 2011, each of which is hereby incorporated by reference in the present disclosure in its entirety.

TECHNICAL FIELD

The present invention relates to a vapor deposition particle emitting device, a vapor deposition apparatus including the vapor deposition particle emitting device as a vapor deposition source, and a vapor deposition method using the vapor deposition apparatus.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic EL element which uses electroluminescence (hereinafter abbreviated to "EL") of an organic material and that (ii) is an all-solid-state flat-panel display which is excellent in, for example, low-voltage driving, high-speed response, and self-emitting characteristics.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT.

The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes, as sub-pixels aligned on a substrate, organic EL elements of red (R), green (G), and blue (B). The full-color organic EL display device carries out an image display by, with use of TFTs, selectively causing the organic EL elements to each emit light with a desired luminance.

The organic EL elements in a light-emitting section of such an organic EL display device is generally formed by multi-layer vapor deposition of organic films. In production of an organic EL display device, it is necessary to form, for each organic EL element that is a light-emitting element, at least a luminescent layer of a predetermined pattern made of an organic luminescent material which emits light of the colors.

In formation of films in a predetermined pattern by multi-layer vapor deposition, a method such as a vapor deposition method that uses a mask referred to as a shadow mask, an inkjet method or a laser transfer method is applicable. Among these methods, the vapor deposition method that uses a mask referred to as a shadow mask is the most common method.

In a vapor deposition method employing a mask called a shadow mask, a vapor deposition source that evaporates or sublimates a vapor deposition material is provided in a chamber inside which a reduced-pressure condition can be maintained. Then, for example, under a high-vacuum condition, the vapor deposition source is heated, and thereby the vapor deposition material is evaporated or sublimated.

Thus evaporated or sublimated vapor deposition material is vapor-deposited, as vapor deposition particles, onto a film formation target substrate onto which a film is to be formed. This vapor deposition is carried out through apertures provided to the mask for vapor deposition, so that a desired film pattern is formed.

However, in such a case of vapor deposition by evaporation or sublimation of a vapor deposition material, that portion of the vapor deposition material which has adhered to or has accumulated on a place other than the film formation target substrate end up as a material loss unless it is recovered.

In particular, an organic material that constitutes such an organic EL layer as that described above is a special functional material having electric conductivity, a carrier-transporting property, a light-emitting property, thermal and electrical stability, etc., and the unit price of such a material is vary high.

For this reason, in order to improve efficiency in the use of material, it is desirable to recover and reuse that portion of the vapor deposition material which has adhered to a place other than the film formation target substrate.

Note that the term "efficiency in the use of material" refers to the ratio of that portion of a vapor deposition material for use in vapor deposition which is actually utilized.

Patent Literature 1 discloses a vapor deposition apparatus and a vapor deposition method for reducing an amount of a vapor deposition material that accumulates on a place other than a film formation target substrate, and for recovering and reusing that portion of the vapor deposition material which has accumulated on a place other than the film formation target substrate.

FIG. 19 is a cross-sectional view schematically showing a vacuum vapor deposition apparatus as described in Patent Literature 1.

The vapor deposition apparatus 500 described in Patent Literature 1 includes: a vapor deposition source 501; a vapor outlet 502 serving as an emission hole of the vapor deposition source 501; and a vapor deposition material recovery tool 510 which includes a barrier 511 surrounding the vapor outlet 502 and a vapor flow release outlet 512 facing the vapor outlet 502 and which serves as a cover member that covers the vapor outlet 502.

The barrier 511 has its inner surface spherically concaved, with the vapor flow release outlet 512 formed at the top thereof.

Placed above the vapor deposition source 501 are a film formation target substrate 200 and a vapor deposition mask 531. Note that in Patent Literature 1, the mask 531 is placed over a predetermined position on a film formation target surface of the film formation target substrate 200.

According to Patent Literature 1, a vapor deposition material having accumulated on the barrier 511 is recovered by taking the vapor deposition material recovery tool 510 out of a vapor deposition chamber 521 after performing vapor deposition while controlling an angle of divergence of a vapor flow (vapor deposition flow) that flows from the vapor deposition source 501 toward the film formation target substrate 200.

According to Patent Literature 1, only that portion of the vapor flow emitted through the vapor outlet 502 which has passed through the vapor flow release outlet 512 is supplied toward the film formation target substrate 200, and that portion of the vapor flow which flow toward the barrier 511 stays within the vapor deposition recovery tool 510.

This makes it possible, with the vapor deposition material recovery tool 510, to recover that portion of the vapor flow emitted through the vapor outlet 502 which has passed flows toward a place other than the film formation target substrate 200, thus making it possible, by reusing the vapor deposition material thus recovered, to increase the efficiency in the use of material.

CITATION LIST

Patent Literature 1

Japanese Patent Application Publication, Tokukai, No. 2008-223102 (Publication Date: Sep. 25, 2008)

SUMMARY OF INVENTION

Technical Problem

However, in Patent Literature 1, it is necessary, as mentioned above, to take the vapor deposition material recovery tool 510 out of the vapor deposition chamber 521 in order to recover a vapor deposition material having adhered to the vapor deposition material recovery tool 510.

This requires much time and labor to attach and detach the vapor deposition material recovery tool 510.

Furthermore, it is necessary to stop the apparatus, such as removing a vacuum, in order to take the vapor deposition material recovery tool 510 out of the vapor deposition chamber 521, and start up the apparatus again. This causes a reduction in production efficiency.

Further, in order to recover a vapor deposition material from the vapor deposition material recovery tool 510, it is necessary, for example, that that portion of the vapor deposition material which has accumulated on the barrier 511 be heat for evaporation or sublimation and then cooled for recovery, which requires much time and labor.

Further, the method described in Patent Literature 1 has such a problem that that portion of a vapor deposition material which has adhered to the vapor deposition material recovery tool 510 at a opening rim of the vapor flow release outlet 512 or at the barrier 511 may fall during vapor deposition, i.e., during production of the aforementioned organic EL panel for example, to form a fallen vapor deposition material (dust) that causes a defect in the product.

Further, since the vapor deposition material recovery tool 510 is taken out of the vapor deposition chamber 521, it is necessary to purify the material for contamination removal, which causes an increase in cost.

Further, the vacuum vapor deposition apparatus 500 described in Patent Literature 1 uses the vapor deposition material recovery tool 510 to recover a vapor deposition material that flows toward a place other than the film formation target substrate 200, but does not have means for collimating the vapor deposition flow. Therefore, as shown in FIG. 19, the vapor flow spreads after having passed through the vapor flow release outlet 512. This causes blurring of a formed film pattern.

In particular, although Patent Literature 1 discloses providing a heater to prevent the opening rim of the vapor flow release outlet 512 from being clogged by a vapor deposition material adhering to the opening rim, such a configuration causes vapor deposition particles to be scattered at the vapor flow release outlet 512.

In this way, in a conventional vapor deposition apparatus, a pattern cannot be formed with a predetermined precision. As a result, it has not been possible to produce a panel with a high display quality.

The present invention is attained in view of the above problems. An object of the present invention is to provide a vapor deposition particle emitting device and a vapor deposition apparatus, and a vapor deposition method each of which makes it possible to suppress blurring of a formed film pattern and to produce a high display quality panel, as well as to eliminate the conventional need to separately provide a cover member for recovery of a vapor deposition material and to recover and reuse the vapor deposition material without taking it out of the apparatus.

Solution to Problem

In order to solve the foregoing problems, a vapor deposition particle emitting device according to the present invention is a vapor deposition particle emitting device, including a vapor deposition particle generating section which generates a gas of vapor deposition particles by heating a vapor deposition material, for turning the vapor deposition material into the gas of vapor deposition particles by heating the vapor deposition material and for emitting the vapor deposition particles outward, the vapor deposition particle emitting device including: (1) a rotor which is hollow, the rotor being provided with at least one pair of nozzle sections each having a plurality of through-holes through which the vapor deposition particles are emitted, the at least one pair of nozzle sections symmetrically facing each other in a direction in which the thorough-holes extend; (2) a rolling mechanism which causes the rotor to rotate so that the pair of nozzle sections swap their places with each other; and (3) a plurality of temperature adjustment members provided for each separate one of the nozzle sections, the rolling mechanism causing one of the nozzle sections of the rotor to be held to face outward, the nozzle section facing outward being cooled by its corresponding temperature adjustment member to a temperature lower than a temperature at which the vapor deposition material turns into the gas, the nozzle section paired with the nozzle section facing outward being heated by its corresponding temperature adjustment member to a temperature equal to or higher than the temperature at which the vapor deposition material turns into the gas, when the rolling mechanism causes the rotor to rotate, the temperature adjustment members switching between cooling and heating in accordance with placement of the nozzle sections.

Note that the temperature at which the vapor deposition material turns into gas in the above description indicates an evaporation temperature in a case where the vapor deposition material is evaporated or a sublimation temperature in a case where the vapor deposition material is sublimated.

In the above configuration, the through-holes in the nozzle section that face outward, which are used as emission holes through which vapor deposition particle flow out, are set at a temperature that is lower than a temperature at which the vapor deposition material turns into gas, as described above. This makes it possible to block an oblique-flow component of a vapor deposition flow. Therefore, collimation of the vapor deposition flow by a physical length (nozzle length) of each through-hole in the nozzle section becomes possible.

On the other hand, however, vapor deposition particles of an organic material or the like forms an adhering substance that adheres to the wall surfaces of the through-holes in a nozzle section that is used as a cooled nozzle section.

For this reason, a lengthening of accumulated time during which the vapor deposition particle emitting device 30 is used leads to an increase in the amount of the adhering substance having adhered to the apertures in the nozzle section that is used as a cooled nozzle section, with the result that the apertures get clogged.

Further, a reduction in aperture area of each of the apertures in a nozzle section, especially the apertures in the nozzle section that are used as emission holes through which vapor deposition particles are emitted out of the vapor deposition particle emitting device 30, may affect a film thickness distribution on the film formation target substrate.

By causing the cooled nozzle section and the heated nozzle section to replace each other through an operation of rotation of the rotor by the rolling mechanism and gasifying (re-evaporating or re-sublimating) the adhering substance having adhered to the nozzle wall surfaces by heating the adhering substance, clogging of the nozzle sections can be eliminated without carrying out special work of taking the vapor deposition particle emitting device out of the film formation chamber, disassemble it, or carrying out maintenance on it. Further, since the adhering substance can be reused as a vapor deposition material, the efficiency in the use of material can be dramatically increased.

This eliminates the need to separately provide a cover member for recovering the vapor deposition material as in Patent Literature 1 and makes it possible to recover and reuse the vapor deposition material without taking it out of the apparatus.

Furthermore, the vapor deposition flow can be collimated as described above. This makes it possible to suppress blurring of a formed film pattern and to produce a high display quality panel.

In order to solve the foregoing problems, a vapor deposition apparatus according to the present invention is a vapor deposition apparatus for forming a film in a predetermined pattern on a film formation target substrate, the vapor deposition apparatus including: (1) the vapor deposition particle emitting device of the present invention; (2) a vapor deposition mask including through holes, the vapor deposition mask allowing the vapor deposition particles having been emitted from the vapor deposition particle emitting device to pass through the through holes so that the vapor deposition particles are vapor-deposited onto the film formation target substrate, the vapor deposition mask having an area that is smaller than an area of a vapor deposition target region of the film formation target substrate; and (3) moving means that moves at least either one of (i) the film formation target substrate and (ii) a combination of the vapor deposition particle emitting device and the vapor deposition mask relative to the other with the vapor deposition mask and the film-formed substrate kept apart at a constant distance from each other.

Further, in order to solve the foregoing problems, a vapor deposition method according to the present invention is a vapor deposition method for forming a film in a predetermined pattern on a film formation target substrate by using the vapor deposition apparatus according to the present invention, the vapor deposition method including the steps of: (1) performing vapor deposition while moving at least either one of (i) the film formation target substrate and (ii) a combination of the vapor deposition particle emitting device and the vapor deposition mask relative to the other with the vapor deposition mask and the film-formed substrate kept apart at a constant distance from each other; and (2) by using the rolling mechanism to cause the rotor to rotate, causing a nozzle section facing outward and a nozzle section paired with the nozzle section to swap their places with each other and switching between cooling and heating.

In a case where a vapor-deposited film is formed by use of a vapor deposition mask that is smaller in area than the vapor deposition target region of the film formation target substrate in a state where the film formation target substrate and the vapor deposition mask are set apart from each other, conventionally, vapor deposition particles having traveled from the vapor deposition particle emitting device and having passed through the through holes (mask aperture pattern) in the vapor deposition mask are scattered by the through holes in the vapor deposition mask. Thus scattered vapor deposition particles adhere to the film formation target substrate, so that a film pattern is formed. This has conventionally caused blurring of a formed film pattern, thus making it impossible to form a formed film pattern with a predetermined degree of accuracy.

However, in each of the above described configurations, the vapor deposition apparatus includes the vapor deposition particle emitting device. This can make (i) directions in which the vapor deposition particles travel from a position at which the vapor deposition particles have been emitted from the vapor deposition particle emitting device to a position at which the vapor deposition particles reaches the vapor deposition mask be parallel to (ii) the normal direction with respect to the film formation target surface of the film formation target substrate (i.e., a normal direction with respect to a mask surface of the vapor deposition mask).

Therefore, in each of the above described configurations, the vapor deposition particles that travel in a direction that is perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

Further, the inclusion of the vapor deposition particle emitting device in the vapor deposition apparatus makes it possible to eliminate clogging of the nozzle sections without carrying out special work of taking the vapor deposition particle emitting device out of the film formation chamber, disassemble it, or carrying out maintenance on it. This makes it possible to recover and reuse the vapor deposition material without taking it out of the apparatus.

Further, since the adhering substance can be reused as a vapor deposition material, the efficiency in the use of material can be dramatically increased.

This makes it possible to suppress blurring of a formed film pattern and to inexpensively produce a high display quality panel.

Advantageous Effects of Invention

In the above configuration, the through-holes in the nozzle section that face outward, which are used as emission holes through which vapor deposition particle flow out, are set at a temperature that is lower than a temperature at which the vapor deposition material turns into gas, as described above. This makes it possible to block an oblique-flow component of a vapor deposition flow. Therefore, collimation of the vapor deposition flow by a physical length (nozzle length) of each through-hole in the nozzle section becomes possible.

By causing the cooled nozzle section and the heated nozzle section to replace each other through an operation of rotation of the rotor by the rolling mechanism and re-evaporating or re-sublimating the adhering substance having adhered to the nozzle wall surfaces by heating the adhering substance, clogging of the nozzle sections can be eliminated without carrying out special work of taking the vapor deposition particle emitting device out of the film formation chamber, disassemble it, or carrying out maintenance on it. Further, since the adhering substance can be reused as a vapor deposition material, the efficiency in the use of material can be dramatically increased.

This eliminates the need to separately provide a cover member for recovering the vapor deposition material as in Patent Literature 1 and makes it possible to recover and reuse the vapor deposition material without taking it out of the apparatus.

Furthermore, the vapor deposition flow can be collimated as described above. This makes it possible to suppress blurring of a formed film pattern and to produce a high display quality panel.

DESCRIPTION OF EMBODIMENTS

The following discusses embodiments of the present invention.

Embodiment 1

Figure 1:
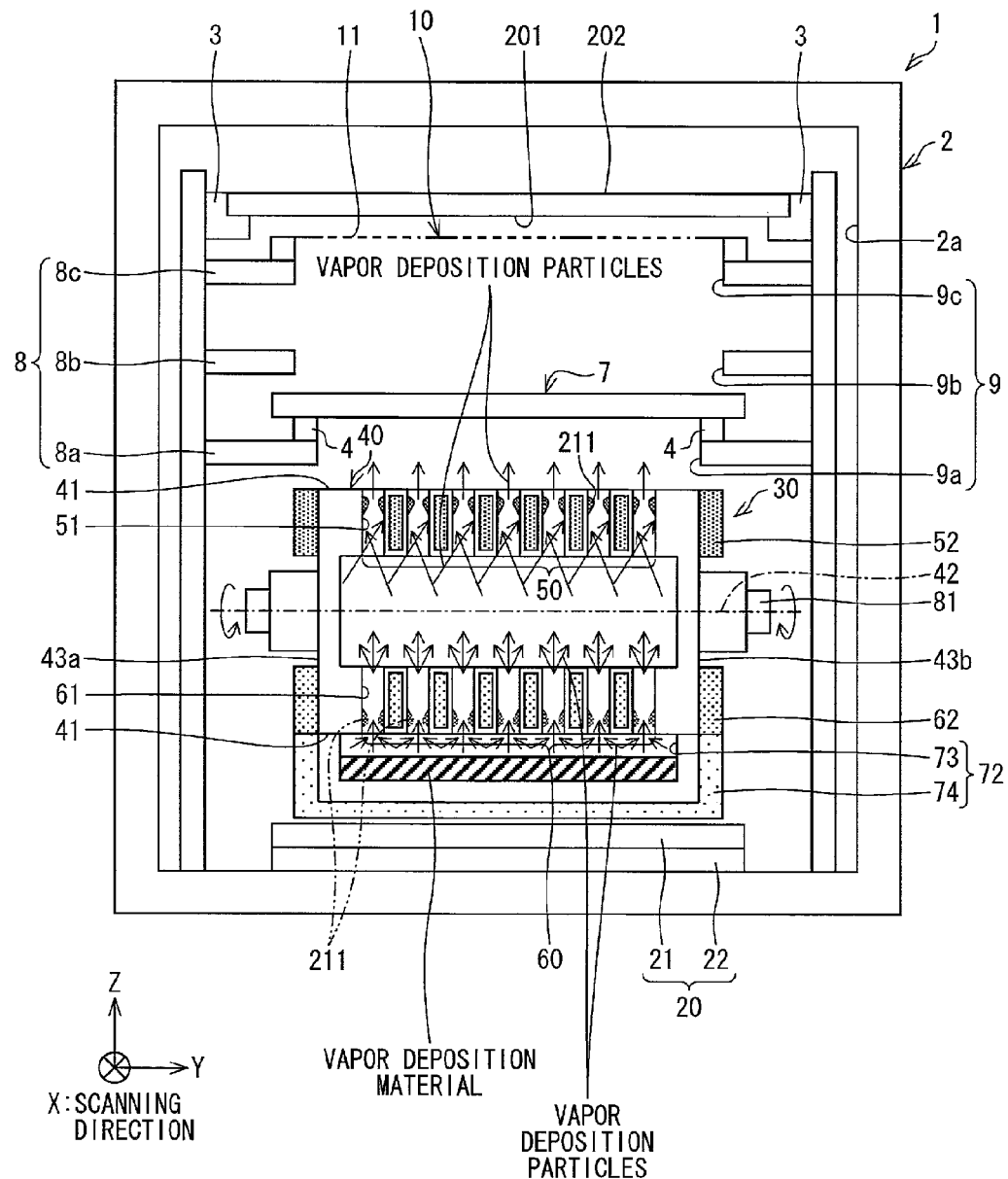
FIG. 1 is a cross-sectional view schematically showing a configuration of a main part of a vapor deposition apparatus according to Embodiment 1 of the present invention.
Figure 2:
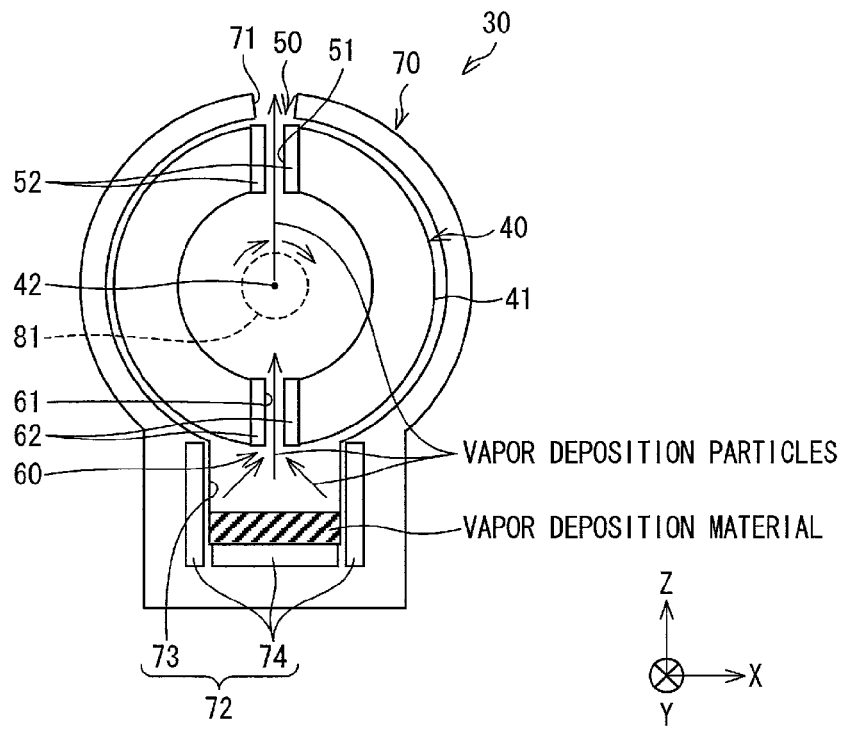
FIG. 2 is a cross-sectional view schematically showing a configuration of a vapor deposition particle emitting device according to Embodiment 1 of the present invention.
Figure 3:
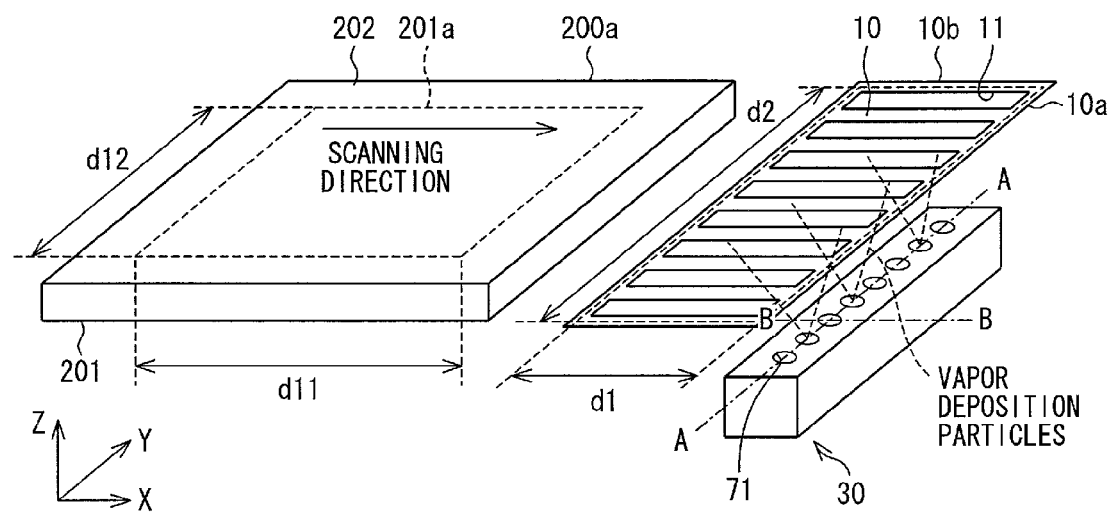
FIG. 3 is an overhead view showing main components in a vacuum chamber in the vapor deposition apparatus according to Embodiment 1 of the present invention.

The following discusses one embodiment of the present invention, with reference to FIGS. 1 through 9.
<Vapor Deposition System>
The following discusses a vapor deposition system employed in a vapor deposition method according to Embodiment 1, with reference to FIG. 3.

FIG. 3 is an overhead view showing main components in a vacuum chamber in a vapor deposition apparatus according to Embodiment 1. Note that FIG. 3 shows a vapor deposition particle emitting device in a simplified manner.

As shown in FIG. 3, in the vapor deposition apparatus and the vapor deposition method according to Embodiment 1, vapor deposition, i.e., film formation is carried out in a state where a mask 10 (vapor deposition mask) for vapor deposition, which is called a shadow mask, is arranged to be apart from a film formation target substrate 200.

In the vapor deposition apparatus and the vapor deposition method according to Embodiment 1, respective positions of the mask 10 and the vapor deposition particle emitting device 30 as a vapor deposition source relative to each other are fixed. The vapor deposition particle emitting device 30 and the mask 10 are kept apart from each other so that a predetermined distance is kept between the vapor deposition particle emitting device 30 and the mask 10 in a z-axis direction which is a direction perpendicular to a mask surface of the mask 10 (i.e., a surface where apertures are formed in the mask 10).

Note that Embodiment 1 described below discusses a case, as an example, where as shown in FIG. 3, a vapor deposition material is vapor-deposited on the film formation target substrate 200 through apertures 11 (through-holes) that are provided in the mask 10. The mask 10 used in this case is smaller in size than the film formation target substrate 200. Further, vapor deposition in this case is carried out by (i) fixing the vapor deposition particle emitting device 30 and the mask 10, and (ii) carrying (in-line transfer) the film formation target substrate 200 in a direction parallel to a longitudinal direction of the film formation target substrate 200 and thereby causing the film formation target substrate 200 to pass above the mask 10.

However, the present invention is not limited to this configuration. That is, while the film formation target substrate 200 is fixed, the vapor deposition particles emitting device 30 and the mask 10 may be moved. In other words, at least one of the film formation target substrate 200 and a set of the vapor deposition particle emitting device 30 and the mask 10 may be moved relative to the other.

Further, a direction of a long side 200a of the film formation target substrate 200 with respect to the mask 10 is not limited to the foregoing configuration. Depending on a size of the film formation target substrate 200, the mask 10 and the film formation target substrate 200 may certainly be configured so that the long side 200a of the film formation target substrate 200 is parallel to a long side 10a of the mask 10.

Further, it is only necessary to fix the respective positions of the vapor deposition particle emitting device 30 and the mask 10 relative to each other. Accordingly, the vapor deposition particle emitting device 30 and the mask 10 may be integrally provided as a mask unit by use of a single holding member such as a holder, or alternatively, may be separately provided.

In a case where the set of the vapor deposition particle emitting device 30 and the mask 10 are moved relative to the film formation target substrate 200, the set of the vapor deposition particle emitting device 30 and the mask 10 may be moved by use of one moving mechanism while being held by a single holding member.

<Overall Configuration of a Vapor Deposition Apparatus>

FIG. 1 is a cross-sectional view schematically showing a configuration of a main part of a vapor deposition apparatus according to Embodiment 1.

Note that FIG. 1 schematically shows a cross section, taken along line A-A of FIG. 3, of a configuration of a main part in the vapor deposition apparatus.

For convenience of illustration, FIGS. 1 and 3 each have a different number of apertures as the emission holes in the vapor deposition particle emitting device. This by no means influences effects of Embodiment 1 and therefore by no means varies the effects obtained by Embodiment 1.

As shown in FIG. 1, the vapor deposition apparatus 1 of Embodiment 1 is configured to include, as shown in FIG. 2, a vacuum chamber 2 (film forming chamber), and a substrate moving unit 3, a mask moving unit 4, a shutter operation unit 5, a holder 6, a shutter 7, a mask 10 (vapor deposition mask), a vapor deposition particle emitting device shifting unit 20, and a vapor deposition particle emitting device 30 (vapor deposition source) which are provided in the vacuum chamber 2.

<Configuration of the Vacuum Chamber 2>

The vacuum chamber 2 is provided with a vacuum pump (not illustrated) that performs vacuum-pumping of the vacuum chamber 2 via an exhaust port (not illustrated) of the vacuum chamber 2 so that a vacuum state is kept inside the vacuum chamber 2 during vapor deposition.

<Configuration of the Substrate Moving Unit 3>

The substrate moving unit 3 (substrate transfer unit) includes a motor (not illustrated) such as an XYθ drive motor. While holding the film formation target substrate 200, the substrate moving unit 3 moves the vapor deposition target substrate 200 by driving the motor by use of a motor drive control section (not illustrated).

The substrate moving unit 3 moves the film formation target substrate 200 such as a TFT substrate, while holding the film formation target substrate 200 so that a film formation target surface 201 of the film formation target substrate 200 faces a mask surface of the mask 10.

As shown in FIG. 3, Embodiment 1 employs the mask 10 that is smaller in size than the film formation target substrate 200. Further, the substrate moving unit 3 is used for carrying (in-line transfer) the film formation target substrate 200 in an X-axis direction in an YX plane so that the film formation target substrate 200 passes above the mask 10, whereby vapor deposition of a vapor deposition material is carried out.

Furthermore, on the film formation target substrate 200, an alignment marker (not illustrated) is provided for alignment between the mask 10 and the film formation target substrate 200.

The substrate moving unit 3 drives a motor (not illustrated) such as an XYθ drive motor as described above and thereby corrects a position of the film formation target substrate 200 to an appropriate position by eliminating misalignment of the film formation target substrate 200.

<Configuration of the Mask 10>

As shown in FIG. 3, Embodiment 1 employs the mask 10 that is a rectangular (belt shape) vapor deposition mask. By using such a mask 10, the film formation target substrate 200 is scanned in a direction along a longitudinal direction of the film formation target substrate 200.

The shadow mask 10, as shown in FIGS. 1 and 3, has a plurality of apertures 11 (through-holes) arranged in a one-dimensional direction and each having, for example, a belt shape (stripe shape).

The plurality of apertures 11 are provided so that a longitudinal direction of each of the apertures 11 is parallel to a scanning direction (substrate carrying direction, X-axis direction in FIGS. 1 and 3). The plurality of apertures 11 are provided so as to be aligned in a direction (Y-axis direction in FIGS. 1 and 3) perpendicular to the scanning direction.

In Embodiment 1, as shown in FIG. 3, the plurality of apertures 11 each stretching in a direction parallel to a short side 10b of the mask 10 are aligned in a longitudinal direction of the mask 10.

As shown in FIG. 3, the mask 10 of Embodiment 1 is formed so that in a direction parallel to the scanning direction of the film formation target substrate 200, a width d1 of each of the apertures 11 of the mask 10 is shorter than a width d11 of a film formation target region (panel region 201a) on the film formation target surface 201 of the film formation target substrate 200.

Meanwhile, the mask 10 of Embodiment 1 is formed so that in a direction perpendicular to the scanning direction of the film formation target substrate 200, for example, a width d2 of a vapor deposition region (i.e., a region where a group of apertures 11 are formed) of the mask 10 is arranged so as to correspond to, for example, a width d12 of the film formation target region (panel region 201a) of the film formation target substrate 200. This makes it possible to form a film all over the film formation target region by one scan, in the direction perpendicular to the scanning direction of the film formation target substrate 200. Note, however, that Embodiment 1 is not limited to this configuration.

Note that a region where deposition of the vapor deposition particles is undesirable on the film formation target substrate 200 is covered with the shutter 7 and a projecting section 8, as shown in FIG. 1. The projecting section 8 serves as a deposition preventing plate in the holder 6. The projection section 8 will be described later.

Further, note that the mask 10 is preferably a metal mask, for example. However, the mask 10 is not limited to a metal mask.

<Configuration of the Mask Moving Unit 4>

As shown in FIG. 1, the mask moving unit 4 includes a motor (not illustrated) such as an XYθ drive motor. While holding the mask 10 for vapor deposition, the mask moving unit 4 moves the mask 10 by driving the motor by use of a motor drive control section (not illustrated). The mask moving unit 4 moves the mask 10 while keeping the respective positions of the mask 10 and the vapor deposition particle emitting device 30 relative to each other.

Though the respective positions of the mask 10 and the vapor deposition particle emitting device 30 relative to each other are fixed, there still exists a minute operation region in which alignment is to be carried out.

In other words, the relative positional relation of the mask 10 and the vapor deposition particle emitting device 30 is fixed except for a case where alignment, minute adjustment such as a space adjustment, or the like is carried out.

On the mask 10, an alignment marker (not illustrated) is provided for alignment of the mask 10 and the film formation target substrate 200. Further, on the mask 10, an absolute alignment marker (not illustrated) is provided for absolute alignment of the mask 10 and the vapor deposition apparatus 1. Meanwhile, in the vacuum chamber 2, a reference marker (not illustrated) for absolute alignment is provided so as to correspond to an absolute position of the mask 10.

Note that the above absolute position of the mask 10 is determined in advance in designing a device, in accordance with respective positions of the mask 10 and the vapor deposition apparatus 1 relative to each other or respective positions of the mask 10 and the vapor deposition particle emitting device 30 relative to each other.

As described above, the mask moving unit 4 drives a motor (not illustrated) such as an XYθ drive motor as described above and thereby corrects a position of the mask 10 to an appropriate position by eliminating misalignment of the mask 10.

<Configuration of the Shutter 7>

As shown in FIG. 1, the shutter 7 is provided between the mask 10 and the vapor deposition particle emitting device 30, so as to control whether or not the vapor deposition particles emitted from the vapor deposition particle emitting device 30 are allowed to reach the mask 10. The shutter 7 determines whether or not to inject the vapor deposition particles toward the film formation target substrate 200.

The shutter 7 prevents the vapor deposition particles from being emitted into the vacuum chamber 2 when a vapor deposition rate is to be stabilized or vapor deposition is not required. For example, during alignment of the film formation target substrate 200 and the mask 10, the shutter 7 blocks an injection path of the vapor deposition particles so as to prevent the vapor deposition particles from reaching the film formation target substrate 200.

The shutter 7 is configured so that, for example, the shutter operation unit 5 can move back and forth (insert) the shutter 7 between the mask 10 and the vapor deposition particle emitting device 30.

The shutter 7 covers emission holes for the vapor deposition particles (vapor deposition material) in the vapor deposition particle emitting device 30 while a film is not being formed on the vapor deposition target substrate 200.

<Configuration of the Shutter Operation Unit 5>

As shown in FIG. 1, the shutter operation unit 5 holds the shutter 7 and operates the shutter 7 in accordance with a vapor deposition OFF signal/vapor deposition ON signal from a control section (not illustrate).

The shutter operation unit 5 includes, for example, a motor (not illustrated). The shutter operation unit 5 operates (moves) the shutter 7 by driving the motor by use of a motor drive control section (not illustrated). For example, the shutter operation unit 5 inserts the shutter 7 between the mask 10 and the vapor deposition particle emitting device 30 in accordance with the vapor deposition OFF signal from the control section (not illustrated) and thereby closes the emission holes for the vapor deposition particle emitting device 30. Meanwhile, the shutter operation unit 5 is caused to work in accordance with the vapor deposition ON signal from the control section (not illustrated) and thereby opens the emission holes.

As described above, by causing the shutter operation unit 5 to work and thereby inserting as appropriate the shutter 7 between the mask 10 and the vapor deposition particle emitting device 30, it is possible to prevent vapor deposition on an unwanted region (non-vapor-deposition-target region) of the film formation target substrate 200.

<Configuration of the Holder 6>

Further, as shown in FIG. 1, in the vacuum chamber 2, the holder 6 is provided so as to be adjacent to an inner wall 2a of the vacuum chamber 2. This holder 6 serves both as a deposition preventing plate and as means for holding components in the vacuum chamber.

The holder 6 is provided so as to cover a region where the vapor deposition particles might fly in the vacuum chamber 2 but where deposition of the vapor deposition particles is not desirable (The above region covered with the holder 6 is a region where the vapor deposition particles might unnecessarily fly, other than an injection path that is a region where the vapor deposition particles are required to fly). The region includes, for example, a region surrounding the vapor deposition particle emitting device 30 and the inner wall 2a of the vacuum chamber 2, while excluding an injection path of the vapor deposition particles which injection path connects the emission holes of the vapor deposition particle emitting device 30 and an aperture region (region where a group of apertures are formed) of the mask 10.

The holder 6 is provided with a plurality of projecting sections 8 each of which is configured to have an opening 9 that serves as a vapor flow discharge opening. Note that FIG. 1 shows, as one example, a case where the holder 6 is provided with three projecting sections 8 including a first projecting section 8a having a first opening 9a, a second projecting section 8b having a second opening 9b, and a third projecting section 8c having a third opening 9c in this order from the vapor deposition particle emitting device 30 side.

In one example configuration, the mask moving unit 4 is held by the first projecting section 8a while the shutter operation unit 5 is held by the third projecting section 8c. Further, the substrate moving unit 3 is provided above the first projecting section 8a so as to overlap the first projection section 8a.

As shown in FIG. 1, in the vapor deposition apparatus 1, the vapor deposition particles emitted from the vapor deposition particle emitting device 30 are regulated so that the vapor deposition particles fly below the mask 10. The vapor deposition particles that fly beyond a region below the mask 10 are blocked as appropriate by the holder 6 that also serves as a deposition preventing plate (shielding plate).

This makes it possible to prevent the vapor deposition particles from being undesirably deposited on a region other than the aperture region of the mask 10, and thereby to prevent contamination of such a region.

<Configuration of the Vapor Deposition Particle Emitting Device Shifting Unit 20>

The vapor deposition particle emitting device 30 is provided so as to face the film formation target substrate 200 via the mask 10. As described above, the respective positions of the mask 10 and the vapor deposition particle emitting device 30 relative to each other are fixed.

Note that in Embodiment 1, the vapor deposition particle emitting device 30 is fixed to a bottom wall of the vacuum chamber 2 via the vapor deposition particle emitting device shifting unit 20. Meanwhile, the mask 10 is held by and fixed to the first projecting section 8a of the holder 6 via the mask moving unit 4. In this way, the respective positions of the vapor deposition particle emitting device 30 and the mask 10 relative to each other are fixed.

However, there also exists a minute operation region in which alignment is to be carried out for the vapor deposition particle emitting device 30.

The vapor deposition particle emitting device shifting unit 20 includes, for example, an actuator 22 and a stage 21 such as an XYZ stage (see FIG. 1).

The stage 21 and the actuator 22 are provided so as to be adjacent to the vapor deposition particle emitting device 30.

The stage 21 holds the vapor deposition particle emitting device 30. Further, the stage 21 includes a motor (not illustrated) such as an XYθ drive motor, and thereby shifts the vapor deposition particle emitting device 30 by driving the motor by use of a motor drive control section (not illustrated).

The actuator 22 is a Z-axis drive actuator. The actuator 22 converts a control signal to motion in a Z-axis direction that is perpendicular to the surface where the apertures are formed to the mask 10, and thereby controls a space (separation distance) between the mask 10 and the deposition particle emitting device 30.

Note that the space between the mask 10 and the vapor deposition particle emitting device 30 can be set as appropriate and not specifically limited. However, the space is desired to be as small as possible for enhancing efficiency in utilization of the vapor deposition material. In one example case, the space is set to approximately 100 mm.

As described above, preferably, the vapor deposition particle emitting device 30 is provided in such a manner that the vapor deposition particle emitting device 30 can be freely shifted by the vapor deposition emitting device shifting unit 20, in any of the X-axis direction, the Y-axis direction, and the Z-axis direction.

<Configuration of the Vapor Deposition Particle Emitting Device 30>

Figure 4:
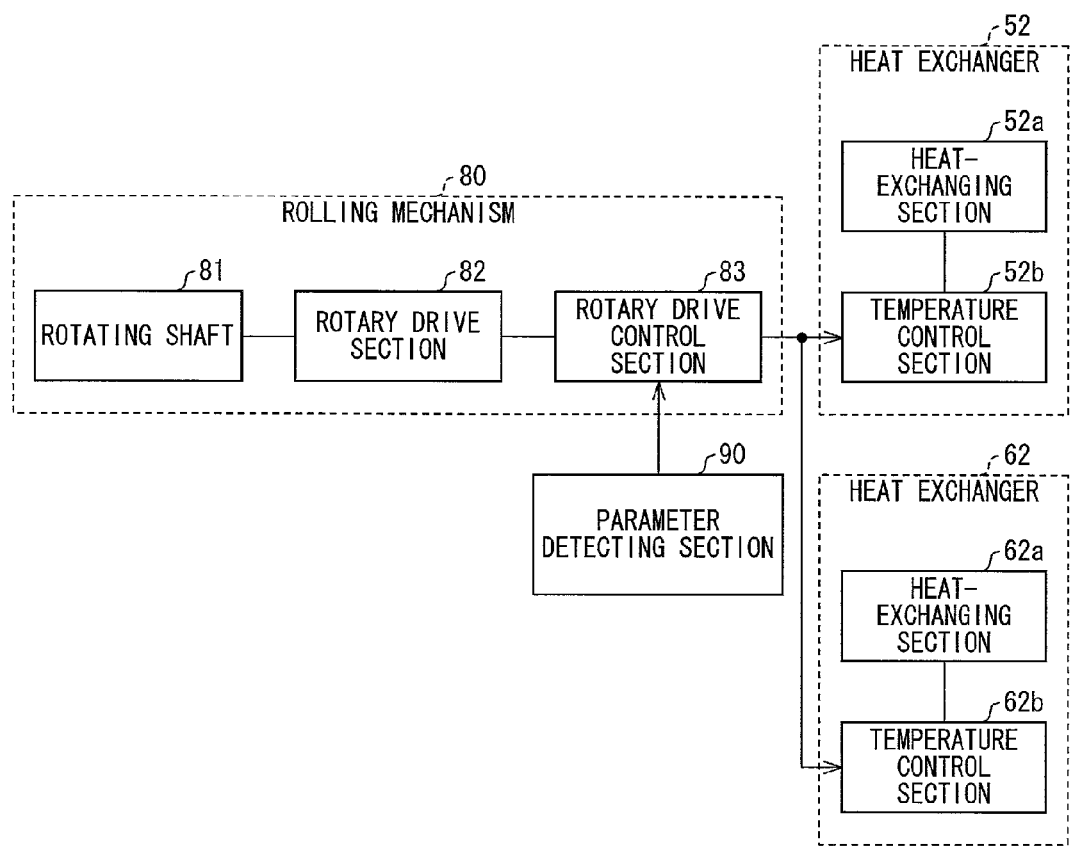
FIG. 4 is a block diagram showing a configuration of a main part of the vapor deposition particle emitting device according to Embodiment 1 of the present invention.

FIG. 2 is a cross-sectional view schematically showing a configuration of the vapor deposition particle emitting device 30 according to Embodiment 1. FIG. 4 is a block diagram showing a configuration of a main part of the vapor deposition particle emitting device 30.

Note that FIG. 2 is a cross-sectional view schematically showing a configuration of the vapor deposition particle emitting device 30 as taken along line B-B of FIG. 3. In other words, is a cross-sectional view schematically showing a configuration of the vapor deposition particle emitting device 30 as taken along a direction perpendicular to a cylindrical axis indicated by an alternate long and short dash line in FIG. 1. Note that FIG. 1 omits to illustrate a vapor deposition particle leakage prevention member shown in FIG. 2.

The vapor deposition particle emitting device 30 evaporates or sublimates, under high vacuum, the vapor deposition material that is a film formation material by heating the vapor deposition material, and then, injects, as the vapor deposition particles, the vapor deposition material such as an organic luminescent material.

Embodiment 1 discusses, as one example, a case where in a state in which the vapor deposition particle emitting device 30 is provided below the film formation target substrate 200 and the film formation target surface 201 of the film formation target substrate 200 faces downward, the vapor deposition particle emitting device 30 carries out vapor deposition (up deposition) of the vapor deposition particles through the apertures 11 of the mask 10 by causing the vapor deposition particles to flow upward from below.

As shown in FIGS. 1, 2, and 4, the vapor deposition particle emitting device 30 according to Embodiment 1 includes: a rotor 40 that is hollow and rotatable; a vapor deposition particle leakage prevention member 70 that surrounds the rotor 40; a rolling mechanism 80 that causes the rotor 40 to rotate; and a parameter detection section 90 that detects parameters for determining a timing of replacement of nozzle sections with each other.

<Configuration of the Rotor 40>

The rotor 40, which is shown in FIGS. 1 and 2, has a cylindrical shape (i.e., a hollow columnar shape), and includes a pair of nozzle sections, namely a first nozzle section 50 and a second nozzle section 60, which are through a circumferential surface 41 (i.e., a cylindrical surface parallel to a cylindrical axis 42 indicated by an alternate long and short dash line in FIG. 1) of the rotor 40, which extend along the cylindrical axis 42, and which symmetrically face each other with a space in the rotor 40 therebetween.

As shown in FIGS. 1 and 2, the first nozzle section 50 has a plurality of apertures 51 (through-holes) (i) opened, for example, along an up-and-down direction, i.e., a direction along which the first nozzle section 50 and the nozzle section are arranged one above the other and (ii) placed at predetermined intervals along a direction perpendicular to the direction in which the aperture 51 extends.

Similarly, as shown in FIGS. 1 and 2, the second nozzle section 60 has a plurality of apertures 61 (through-holes) (i) opened, for example, along the up-and-down direction, i.e., the direction along which the first nozzle section 50 and the nozzle section 60 are arranged one above the other and (ii) placed at predetermined intervals along a direction perpendicular to the direction in which the aperture 61 extends.

In other words, the apertures 51 and 61 are bored through the circumferential surface 41 of the rotor 40 along a direction parallel to the cylindrical axis 42 and placed at predetermined intervals along the cylindrical axis 42.

When viewed from an angle normal to the film formation target surface 201 of the film formation target substrate 200 (i.e., an angle perpendicular to the surfaces through which the apertures 51 and the apertures 61 are bored), each of the apertures 51 appears to correspond in center position (aperture center) to a corresponding one of the apertures 61.

Therefore, when viewed from an angle perpendicular to the surfaces through which the apertures 51 and the apertures 61 are bored, each of the apertures 51 appears to communicate with a corresponding one of the apertures 61 through the space in the rotor 40.

Further, it is preferable that apertures 51 and 61 facing each other, i.e., apertures 51 an 61 coinciding in center position with each other when viewed from an angle perpendicular to the surfaces through which the apertures 51 and the apertures 61 are bored have identical shapes.

Note that in Embodiment 1, as shown in FIGS. 1 and 2, each of the apertures 51 and each of the apertures 61 both have identical shapes (identical shapes and sizes).

Further, for improvement of a film thickness distribution, the apertures may have different shapes (nozzle shapes) in a single nozzle section, i.e., in each of the first and second nozzle sections 50 and 60 in Embodiment 1.

Further, the first nozzle section 50 is provided therein with a heat exchanger 52 that is provided in a region surrounding each of the apertures 51. This heat exchanger 52 serves as a temperature adjustment member that adjusts and controls a temperature of the first nozzle section 50.

The second nozzle section 60 is provided therein with a heat exchanger 62 that is provided in a region surrounding each of the apertures 61. This heat exchanger 62 serves as a temperature adjustment member that adjusts and controls a temperature of the second nozzle section 60.

This allows the first nozzle section 50 and the second nozzle section 60 to adjust and control their respective temperatures independently of each other.

<Configuration of the Vapor Deposition Particle Leakage Prevention Member 70>

As shown in FIGS. 2 and 4, the vapor deposition particle leakage prevention member 70, which surrounds the rotor 40, serves as a housing that covers the rotor 40 except for the outward emission holes in order to prevent vapor deposition particles from leaking out through a part other than the outward emission holes.

One of the pair of nozzle sections faces outward, and the apertures in the nozzle section facing outward are used as emission holes through which vapor deposition particles are emitted outward from the vapor deposition particle emitting device 30.

The vapor deposition particle leakage prevention member 70 has apertures 71 which are used as emission holes through which vapor deposition particles are emitted outward from the vapor deposition particle emitting device 30 and which respectively correspond to the apertures (through-holes) in one of the nozzle sections provided in the circumferential surface 41 of the rotor 40.

This causes only one nozzle section (in the examples shown in FIGS. 1 and 2, the first nozzle section 50) to face outward, and the apertures in the nozzle section facing outward are used as emission holes through which vapor deposition particles are emitted outward from the vapor deposition particle emitting device 30.

Further, the vapor deposition particle emitting device 30 is provided with a vapor deposition particle generating section that generates a gas of vapor deposition particles by heating a vapor deposition material. The vapor deposition particle generating section serves as vapor deposition particle supply means for supplying the nozzle section with vapor deposition particles to be emitted outward.

In the example shown in FIG. 2, the vapor deposition particle leakage prevention member 70 is provided integrally with a crucible section 72 (crucible) serving as a vapor deposition particle generating section to contain and heat a vapor deposition material.

As shown in FIGS. 1 and 2, the crucible section 72 of the vapor deposition particle leakage prevention member 70 includes: a recess 73, provided below the rotor 40, which extends along the cylindrical axis; and a heat exchanger 74, provided around the recess 73, which heat the vapor deposition material in the recess 73 while adjusting and controlling the temperature of the recess 73.

The temperature of the crucible section 72, the temperature of the apertures 51 in the first nozzle section 50, and the temperature of the apertures 61 in the second nozzle section 60 are controlled by the corresponding heat exchangers 74, 52, and 62 highly accurately and independently of each other.

The recess 73 is used as a vapor deposition material containing section that contains a vapor deposition material inside.

The crucible section 72 generates a gas of vapor deposition particles by using the heat exchanger 74 to heat the vapor deposition material in the recess 73 for evaporation (in a case where the vapor deposition material is a liquid material) or sublimation (in a case where the vapor deposition material is a solid material) to turn the vapor deposition material into the gas.

Note that the heat exchanger 74 can be a well-known heat exchanger such as a general heater.

The vapor deposition material turns into high-temperature vapor deposition particles when heated by the crucible section 72, which serves as a vapor deposition particle generating section, to a temperature equal to or higher than the temperature at which the vapor deposition material turns into gas.

Note that the temperature at which the vapor deposition material turns into gas indicates an evaporation temperature (in case of evaporation) or a sublimation temperature (in case of sublimation) of the vapor deposition material.

In general, the vapor deposition particle generating section is set at a temperature equal to or higher than the temperature at which the vapor deposition material turns into gas, for obtaining a higher film formation rate by increasing the vapor deposition particles.

The other one of the pair of nozzle sections, i.e., the nozzle section not facing outward (in the examples shown in FIGS. 1 and 2, the second nozzle section 50) faces the crucible section 72, and the vapor deposition material evaporated or sublimated by the crucible section 72 passes through the apertures in the nozzle section facing the crucible section 72 and is supplied to the apertures in the nozzle section that are used as emission holes.

Note here that as mentioned above, the pair of nozzle sections are symmetrical with each other, and when viewed from the angle of the direction in which the apertures extend, each of the apertures in one of the nozzle sections and a corresponding one of the apertures in the other nozzle section appear to correspond in center position to each other.

Further, a slight clearance of approximately 1 mm is provided between the vapor deposition particle leakage prevention member 70 and the rotor 40 so that there is no obstacle to rotation.

<Configuration of the Rolling Mechanism 80>

Further, the rotor 40 is mounted with the rolling mechanism 80 that cause the rotor 40 to rotate.

As shown in FIGS. 1 and 4, the rolling mechanism 80 according to Embodiment 1 includes: a rotating shaft 81 attached to the rotor 40; a rotary drive section 82, such as a motor, which drives the rotating shaft 81; and a rotary drive control section 83 that controls driving of the rotary drive section 82.

The rotating shaft 81 extends through the centers of end faces of the rotor 40 along a longitudinal direction, i.e., both end faces 43a and 43b of the rotor 40 along the cylindrical axis and protrudes along the cylindrical axis in parallel with a nozzle row-wise direction (i.e., direction in which the apertures constituting each nozzle section are arranged in a row).

The rotary drive control section 83 drive the rotary drive section 82, such as a motor, in accordance with a result of detection sent from the after-mentioned parameter detecting section 90 (see FIG. 4), to cause the rotating shaft 81 to rotate, thereby turning the rotor 40 upside down so that the first and second nozzle sections 50 and 60 change their places with each other.

Either one of the first and second nozzle sections 50 and 60 is used as a cooled nozzle section (low-temperature nozzle section) having a temperature lower than the temperature at which the vapor deposition material turns into gas, and the other one of the first and second nozzle sections 50 and 60 is used as a heated nozzle section (high-temperature nozzle section) heated to a temperature equal to or higher than the temperature at which the vapor deposition material turns into gas.

Note that that the term "low temperature/high temperature) means a relatively low temperature and a relatively high temperature, respectively.

Note here that that one of the first and second nozzle sections 50 and 60 which faces outward, i.e., the upper nozzle section used as emission holes through which vapor deposition particles are emitted outward from the vapor deposition particle emitting device 30 is used as a cooled nozzle section. Further, the other nozzle section, i.e., the lower nozzle section facing the crucible section 72 is used as a heated nozzle section.

Therefore, according to the arrangement of the nozzle sections shown in FIGS. 1 and 2, the first nozzle section 50 is used as a cooled nozzle section, whereas the second nozzle section 60 is used as a heated nozzle section.

Then, by causing the rotating shaft 81 to rotate as described above at a predetermined timing, that one of the pair of nozzle sections which is used as a cooled nozzle section and that one of the pair of nozzle sections which is used as a heated nozzle section are replaced with each other.

This causes the nozzle section that has been used as a cooled nozzle section until then (i.e., until the rotation) to be used as a heated nozzle section and the nozzle section that has been used as a heated nozzle section until then to be used as a cooled nozzle section.

<Description of a Cooled Nozzle Section>

The temperature of the nozzle section that is used as a cooled nozzle section is adjusted and controlled by the corresponding heat exchanger to be a temperature lower than the temperature at which the vapor deposition material turns into the gas.

Note that the temperature of a cooled nozzle section needs only be lower than the temperature at which the vapor deposition particles turn into gas. However, the temperature of the vapor deposition particle emitting nozzle section 61 is preferably set in a range of a temperature equal to or higher than a temperature that is 119° C. lower than the temperature at which the vapor deposition material turns into gas to a temperature equal to or lower than a temperature that is 5° C. lower than a temperature at which the vapor deposition material turns into gas (i.e., a temperature that is 119° C. lower than the temperature at which the vapor deposition material turns into gas≤the temperature of a cooled nozzle section 61≤a temperature that is 5° C. lower than a temperature at which the vapor deposition material turns into gas). This is for the following reasons.

In a case where each of the nozzle sections is made from nickel-plated pure copper, each of the nozzle sections has a thermal expansion coefficient of $16.8 \times 10^{-6}$° C. Here, pure copper is used as a base, because pure copper can be easily processed and makes it possible to obtain a high thermal conductivity. This pure copper is nickel-plated so that no chemical reaction occurs on a surface of each of the nozzle sections.

Assume a case where (i) a plurality of apertures are aligned in one direction in each of the nozzle sections and (ii) a distance (end-to-end distance) between centers of respective endmost apertures of each of the nozzle sections is 1 meter in a case where the above configuration is used for producing a large-size panel. Then, a change of 1° C. in temperature of a material of which each of the nozzle sections is made results in an extension of 16.8 μm in the end-to-end distance.

However, it is required that a shift amount of a position of an aperture of any of the nozzle sections from a predetermined position is required to be at the maximum 2 mm.

In a case where the shift amount becomes greater than 2 mm, a positional shift between a position of the cooled nozzle section and a position of the heated nozzle section (i.e., a positional shift between a position of each aperture 51 in the first nozzle section 50 and a position of each aperture 61 in the second nozzle section 60) becomes too large when viewed from a film formation target surface 201 side of the film formation target substrate 200. This results in a shift in a direction in which the vapor deposition particles are emitted.

Therefore, it is desirable that the temperature of the cooled nozzle section be equal to or higher than a temperature that is 119° C. lower than the temperature at which the vapor deposition material turns into gas. Note that there exists a material whose thermal expansion coefficient is lower for a material of each of the nozzle sections. However, such a low-thermal-expansion-coefficient material is not suitable as a material for each of the nozzle sections in view of workability and thermal conductivity.

Further, in a case where the temperature of the cooled nozzle section is too close to a temperature, such as a sublimation temperature, at which the vapor deposition material turns into gas, deterioration in a vapor deposition particle adsorption effect may occur due to local temperature distribution, etc. Therefore, the temperature of the cooled nozzle section is desirably equal to or lower than a temperature that is 5° C. lower than the temperature at which the vapor deposition material turns into gas.

In the nozzle section that is used as a cooled nozzle section, cooling of the nozzle section makes it possible to causes an oblique-flow component of the vapor deposition flow (vapor flow) to adhere to wall surfaces (nozzle surfaces) of the apertures in the nozzle section. Therefore, the vapor deposition particles of the oblique-flow component can be blocked. This allows a further improvement in collimation characteristic of a vapor deposition flow.

On the other hand, however, vapor deposition particle of an organic material or the like forms an adhering substance 211 that, as shown in FIG. 1, adheres to the wall surfaces of the apertures in a nozzle section that is used as a cooled nozzle section.

For this reason, a lengthening of accumulated time during which the vapor deposition particle emitting device 30 is used leads to an increase in the amount of the adhering substance 211 having adhered to the apertures in the nozzle section that is used as a cooled nozzle section, with the result that the apertures get clogged.

Further, a reduction in aperture area of each of the apertures in a nozzle section, especially the apertures in the upper nozzle section that are used as emission holes through which vapor deposition particles are emitted out of the vapor deposition particle emitting device 30, may affect a film thickness distribution on the film formation target substrate 200.

<Description of a Heated Nozzle Section>

Meanwhile, the temperature of a heated nozzle section is set to a temperature (evaporation temperature or sublimation temperature) equal to or higher than the temperature at which the vapor deposition material turns into the gas.

For this reason, in the heated nozzle section, the adhering substance 211 having adhered to the wall surfaces (nozzle wall surfaces) of the apertures before the rotation (i.e., when the nozzle section is used as a cooled nozzle section) is heated to be re-evaporated or re-sublimated again.

Note that by forming the crucible section 72 as the vapor deposition particle generating section as described above in addition to re-evaporating or re-sublimating the adhering substance 211 having adhered to the nozzle wall surfaces, an amount of a vapor deposition film and a vapor deposition rate are supplemented.

That is, even in a case where a sufficient amount of a vapor deposition film and a sufficient vapor deposition rate cannot be attained simply by re-evaporating or re-sublimating the adhering substance 211 having adhered to the nozzle wall surfaces as described above and reusing it as a vapor deposition material, the lack of vapor deposition material can be compensated for by providing, on the side of the heated nozzle section, the crucible section 72 that turns a normal vapor deposition material into gas by heating it.

In the heated nozzle section and the crucible section 72, the vapor deposition rate is raised by increasing the number of vapor deposition particles. Therefore, it is desirable that the heated nozzle section and the crucible section 72 be set to a temperature higher than the temperature at which the vapor deposition material turns into gas (i.e., to a temperature slightly higher than the temperature at which the vapor deposition material turns into gas).

According to Embodiment 1, as described above, the amount of the vapor deposition film and the vapor deposition rate are supplemented by forming the crucible section 72 as the vapor deposition particle generating section in addition to re-evaporating or re-sublimating the adhering substance 211 having adhered to the nozzle wall surfaces. Looked at from another perspective, the amount of the vapor deposition film and the vapor deposition rate can be supplemented by re-evaporating or re-sublimating the adhering substance 211 having adhered to the nozzle wall surfaces while generating vapor deposition particles in the crucible section 72.

Nevertheless, in the heated nozzle section and the crucible section 72, a necessary film formation rate may not be attained at a temperature lower than a temperature that is 10° C. higher than the temperature at which the vapor deposition material turns into gas. Meanwhile, at a temperature higher than a temperature that is 100° C. higher than the temperature at which the vapor deposition material turns into gas, it is highly possible that thermal decomposition of the vapor deposition material occurs.

For this reason, it is desirable that the heated nozzle section and the crucible section 72 be controlled by the corresponding heat exchangers 62 and 74 to fall within a range of a temperature equal to or higher than a temperature that is 10° C. higher than the temperature at which the vapor deposition material turns into gas to a temperature equal to or lower than a temperature that is 100° C. higher than the temperature at which the vapor deposition material turns into gas (that is, a temperature that is 10° C. higher than the temperature at which the vapor deposition material turns into gas≤the temperature of the vapor deposition particle generating section 41≤a temperature that is 100° C. higher than the temperature at which the vapor deposition material turns into gas).

The heated nozzle section can re-evaporate or re-sublimate the adhering substance 211 having adhered to the nozzle wall surfaces, as long as the heated nozzle section has a temperature equal to or higher than the temperature at which the vapor deposition material turns into gas.

For this reason, the heated nozzle section may be set to a temperature equal to, higher than, or lower than the temperature of the crucible section 72, as long as the heated nozzle section has a temperature equal to or higher than the temperature at which the vapor deposition material turns into gas. In particular, it is preferable that the heated nozzle section be set to a temperature lower than the temperature of the crucible section 72.

As mentioned above, the pair of nozzle sections are symmetrical with each other, and when viewed from the angle of the direction in which the apertures extend, each of the apertures in one of the nozzle sections and a corresponding one of the apertures in the other nozzle section appear to correspond in center position to each other.

For this reason, in the configuration where the pair of nozzle section are provided as described above, an apparent length (aperture length, nozzle length) of the apertures of the nozzle sections in the normal direction with respect to the film formation target surface 201 can be increased. This makes it possible to collimate the vapor deposition flow due to an effect of the nozzle length.

The lower heated nozzle section facing the crucible section 72, which is used as the heated nozzle section, can achieve collimation of a vapor deposition flow through an improvement in the linearity of vapor deposition particles by a physical length (aperture length, nozzle length) of each of the apertures in the nozzle section.

Note, of course, that the upper nozzle section facing outward, which is used as the cooled nozzle section, can also achieve collimation of a vapor deposition flow by a physical length (aperture length, nozzle length) of each of the apertures in the nozzle section as described above, while achieving collimation by blocking an oblique-flow component of the vapor deposition flow as mentioned above.

However, when a temperature of a vapor deposition flow (vapor flow) is lowered at once in the cooled nozzle section, the vapor deposition particles tend to be deposited on wall surfaces (nozzle wall surfaces) of the apertures.

By adjusting and controlling the heated nozzle section to a temperature equal to or higher than the temperature at which the vapor deposition material turns into gas and lower than the temperature of the crucible section 72, the temperature of vapor deposition particles in a path through which the vapor deposition particles are released (emitted) can be lowered stepwise while re-evaporating or re-sublimating the adhering substance 211.

This makes it possible to reduce the amount of the vapor deposition material that adheres to the wall surfaces of the nozzle sections within unit time. At the same time, a pressure in the cooled nozzle section and an area therearound can be reduced. This allows a further improvement in collimation characteristic of a vapor deposition flow.

As described above, according to Embodiment 1, an oblique-flow component of vapor deposition particles can be blocked in the cooled nozzle section as mentioned above. This not only allows an improvement in collimation character of a vapor deposition flow in the cooled nozzle section, but also allows an improvement in collimation characteristic of a vapor deposition flow in the heated nozzle section.

Further, by causing the cooled nozzle section and the heated nozzle section to replace each other through an operation of rotation of the rotor 40 by the rolling mechanism and re-evaporating or re-sublimating the adhering substance 211 having adhered to the nozzle wall surfaces by heating the adhering substance 211, clogging of the nozzle sections can be eliminated without carrying out special work of taking the vapor deposition particle emitting device 30 out of the vacuum chamber, disassemble it, or carrying out maintenance on it. This makes it possible to dramatically increase the efficiency in the use of material. Note that the absence of material deterioration in the case of reuse of the adhering substance 211 as a vapor deposition material has been confirmed by experiment.

The nozzle length of each of the nozzle sections is not particularly limited, but is preferably 50 mm or greater for an improvement in collimation characteristic of vapor deposition particles. Note, of course, that since the pair of nozzle section symmetrically face each other with a space in the rotor 40 therebetween as described above, the pair of nozzle sections be set at the same nozzle length.

The vapor deposition material evaporated or sublimated in the heated nozzle section and the crucible section 72 passes through the heated nozzle section and the space in the rotor 40 to be supplied to the upper, i.e., cooled nozzle section facing outward.

The vapor deposition particles having passed through the apertures in the cooled nozzle section are vapor-deposited on the film formation target surface 201 of the film formation target substrate 200 through the apertures 11 in the mask 10 that is provided above the vapor deposition particle injection device 30.

Note that preferably, a space between the nozzle sections is as small as possible and a space between the nozzle sections (i.e., the space in the rotor 40) is not essential.

However, as described above, the pair of nozzle sections are adjusted and controlled so as to have a different temperature. For this reason, too short a distance between the cooled nozzle section and the heated nozzle section may cause each of the pair of nozzle sections to be affected by the temperature of the other nozzle section, thus leading to a decrease in heating/cooling efficiency.

For this reason, it is preferable that separation distances between every two adjacent nozzle sections in a direction perpendicular to the film formation target surface 201 of the film formation target substrate 200 be 20 mm or longer.

Further, in Embodiment 1, the vacuum chamber 2 is preferably kept under a high vacuum condition and a vacuum (ultimate vacuum) in the vacuum chamber 2 is preferably higher than $10^{-3}$ Pa (in other words, the pressure is lower than $10^{-3}$ Pa).

When the vacuum is higher than $10^{-3}$ Pa, it is possible to achieve a necessary and sufficient value of a mean free path of the vapor deposition particles. Meanwhile, when the vacuum is equal to or lower than $10^{-3}$ Pa, the mean free path becomes shorter. Accordingly, the vapor deposition particles are scattered. This results in a deterioration in an efficiency at which the vapor deposition particles reach the film formation target substrate 200 or in a decrease in collimated components of the vapor deposition particles.

Therefore, Embodiment 1 is configured to have an ultimate vacuum equal to or higher than $1.0 \times 10^{-4}$ Pa more in the vacuum chamber 2 (in other words, the pressure inside the vacuum chamber is set to be at $1.0 \times 10^{-4}$ Pa or less).

<Configuration of the Parameter Detecting Section 90 and Timing of Replacement of Nozzle Sections with Each Other>

Embodiment 1, as described above, turns the rotor 40 upside down at a predetermined timing to replace nozzle sections with each other.

The parameter detecting section 90 detects, in accordance with a preset condition for replacement of the nozzle sections with each other, a parameter for determining a timing at which nozzle sections are replaced with each other. The parameter detecting section 90 also sends, as a result of the detection, a signal indicative of the detected parameter to the rotary drive control section 83.

The rotary drive control section 83 determines, in accordance with the signal sent from the parameter detecting section 90, whether the parameter detected by the parameter detecting section 90 has reached a preset condition (threshold). If the rotary drive control section 83 has determined that the parameter has reached the preset condition, the rotary drive control section 83 drives the rotary drive section 82, such as a motor, to cause the rotating shaft 81 to rotate, thereby replacing a cooled nozzle section and a heated nozzle section with each other.

The parameter detecting section 90 is, for example, an optical sensor such as an image sensor.

The image sensor according to Embodiment 1, which is used as the parameter detecting section 90, includes, for example: an imaging section such as a CCD; and a calculating section which, by analyzing an image sent from the imaging section, calculates a proportion of (a) an adhering substance 211 having adhered to the upper nozzle section that is used as a cooled nozzle section to (b) an aperture area of the upper nozzle section, when viewed from an angle normal to the film formation target surface 201 of the film formation target substrate 200.

The rotary drive control section 83 determines, in accordance with a signal from the parameter detecting section 90, whether the proportion calculated by the calculating section has reached a preset threshold. If the rotary drive control section 83 has determined that the proportion has reached the threshold (for instance, when the adhering substance 211 has come to cover 10% of the aperture area of the upper nozzle section when viewed from the angle normal to the film formation target surface 201 of the film formation target substrate 200), the rotary drive control section 83 replaces the cooled nozzle section and the heated nozzle section with each other.

The timing of replacement of the cooled nozzle section and the heated nozzle section with each other is not limited to the above timing, and can be set as appropriate. In other words, the parameter for determining the timing of replacement of nozzle sections is not limited to the aforementioned proportion. The parameter detecting section 90 may detect a parameter other than such a proportion.

For example, instead of being an optical sensor such as an image sensor, the parameter detecting section 90 may include: a timer section for measuring time (operating time) during which the vapor deposition particle emitting device 30 is used; and a calculating section for accumulating the time during which the vapor deposition particle emitting device 30 is used, as measured by the timer section.

That is, the rotary drive control section 83 may (i) determine, in accordance with a signal from the parameter detecting section 90, whether the accumulated time (accumulated operating time) during which the vapor deposition particle emitting device 30 is used, as calculated by the calculating section, has reached a designated time, and (ii) carry out the aforementioned replacement when the accumulated time during which the vapor deposition particle emitting device 30 is used has reached the designated time.

The parameter detecting section 90 may alternatively be a counter that counts the number of times films are formed. It is needless to explain that in this case, the rotary drive control section 83 (i) determines whether the number of times films are formed, as counted by the counter, has reached a designated number of times, and (ii) carries out the aforementioned replacement when the number of times films are formed, as counted by the counter, has reached the designated number of times. The number of times films are formed can be measured, for example, in accordance with (i) the amount of emission of vapor deposition particles, (ii) a vapor deposition period, (iii) the number of times the substrate moving unit 3 is moved, (iv) the number of times the mask moving unit 4 is moved, and (v) the number of times the vapor deposition particle emitting device shifting unit 20 is moved, each preset for each film formation operation.

The parameter detecting section 90 may further alternatively include (i) light irradiation means for irradiating an adhering substance 211 with light such as laser light, (ii) a detecting section for detecting, for example, the intensity of reflection of or spectrum of reflected light obtained by irradiating the adhering substance 211 with the light such as laser light, and (iii) a calculating section for calculating the amount of the adhering substance 211 from, for example, the intensity of reflection of or spectrum of the reflected light as detected by the detecting section.

In this case, the rotary drive control section 83 controls driving of the rotary drive section 82 on the basis of the determination as to whether the amount of the adhering substance 211 has reached a preset threshold.

According to the description above, the rotary drive control section 83 determines, in accordance with a signal sent from the parameter detecting section 90, whether a parameter detected by the parameter detecting section 90 has reached a preset condition (threshold).

Embodiment 1 may, however, be configured instead such that the parameter detecting section 90 further includes a determining section for determining whether a detected parameter has reached a preset condition (threshold).

That is, Embodiment 1 may be configured such that the parameter detecting section 90, when the parameter has reached a preset condition, supplies the rotary drive control section 83 with, as a nozzle section replacement timing signal, a signal indicating that the parameter has reached the preset condition and that the rotary drive control section 83 controls driving of the rotary drive section 82 in accordance with the nozzle section replacement timing signal.

The following discusses a method of forming a film pattern by use of the vapor deposition apparatus 1, that is, as an example vapor deposition method according to Embodiment 1, a method for producing an organic EL display device that (i) is of a bottom emission type, that is, extracts light from a TFT substrate side, and that (ii) carries out an RGB full color display.

<Overall Configuration of the Organic EL Display Device>

Figure 5:
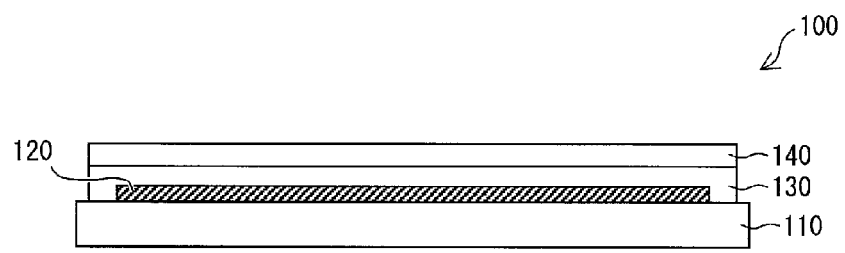
FIG. 5 is a cross-sectional view schematically showing a configuration of an organic EL display device.

FIG. 5 is a cross-sectional view schematically showing a configuration of the organic EL display device.

As shown in FIG. 5, an organic EL display device 100 includes a TFT (thin film transistor) substrate 110, an organic EL element 120, an adhesive layer 130, and a sealing substrate 140.

On the TFT substrate 110, TFTs or the like are each formed as a switching element in a part that serves as a pixel region.

The organic EL element 120 is plurally formed in a matrix manner in a display region of the TFT substrate 110.

The TFT substrate 110 on which organic EL elements 120 are formed is bonded to the sealing substrate 140 by the adhesive layer 130, or the like.

The following describes in detail respective configurations of the TFT substrate 110 and each of the organic EL elements 120 both included in the organic EL display device 100.

<Configuration of the TFT Substrate 110>

Figure 6:
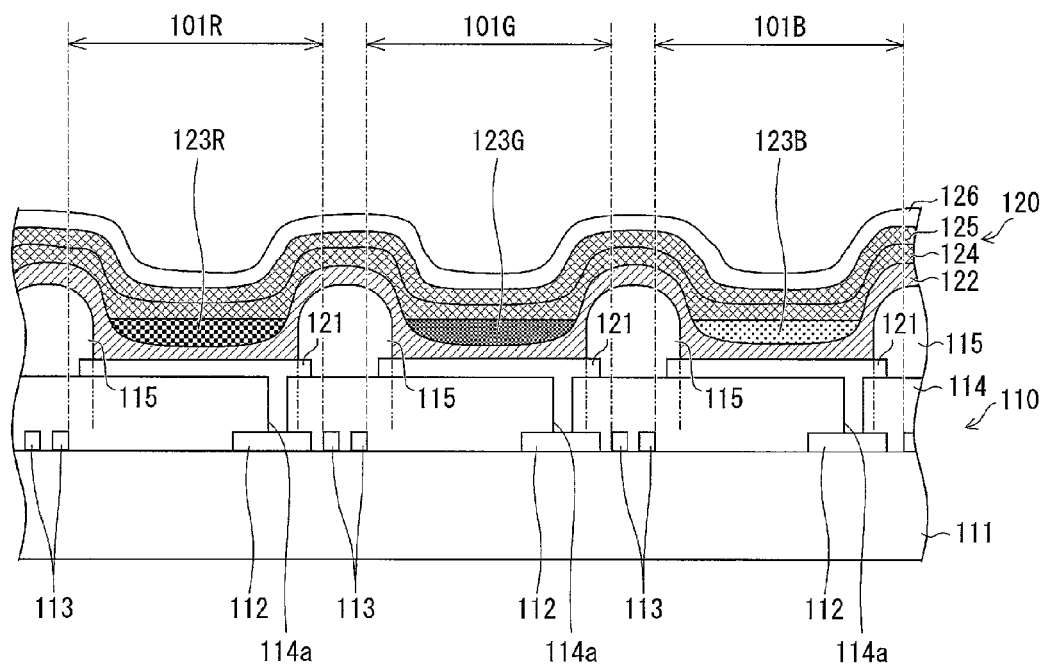
FIG. 6 is a cross-sectional view schematically showing a configuration of an organic EL element constituting a display section of the organic EL display device.

FIG. 6 is a cross-sectional view schematically showing a configuration of the organic EL elements 120 constituting a display section of the organic EL display device 100.

The TFT substrate 110, as shown in FIG. 6, includes on a transparent insulating substrate 111 such as a glass substrate: TFTs 112 (switching elements); wires 113; an interlayer film 114; an edge cover 115; and the like.

The organic EL display device 100 is a full-color active matrix organic EL display device. The organic EL display device 100 includes, on the insulating substrate 111 and in regions defined by the wires 113, pixels 101R, 101G, and 101B arranged in a matrix manner which include organic EL elements 120 of red (R), green (G), and blue (B), respectively.

The TFTs 112 are provided so as to correspond respectively to the pixels 101R, 101G, and 101B. Since the configuration of a TFT has conventionally been well-known, the individual layers of a TFT 112 are not illustrated in the drawings or described herein.

The interlayer insulating film 114 is provided on the insulating substrate 111 throughout the entire region of the insulating substrate 111 to cover the TFTs 112 and the wires 113.

There are provided on the interlayer insulating film 114 first electrodes 121 of the organic EL elements 120.

The interlayer insulating film 114 has contact holes 114a for electrically connecting the first electrodes 121 of the organic EL elements 120 to the TFTs 112. This electrically connects the TFTs 112 to the organic EL elements 120 via the contact holes 114a.

The edge cover 115 is an insulating layer for preventing the first electrode 121 and a second electrode 126 of a corresponding one of the organic EL elements 120 from short-circuiting with each other due to, for example, (i) a reduced thickness of an organic EL layer in an edge section of the first electrode 121 or (ii) an electric field concentration.

The edge cover 115 is so formed on the interlayer insulating film 114 as to cover edge sections of the first electrode 121.

As shown in FIG. 6, the first electrode 121 is exposed in an area where the first electrode 121 is not covered with the edge cover 115. This area that is exposed serves as a light-emitting section of each of the pixels 101R, 101G, and 101B.

The pixels 101R, 101G, and 101B are, in other words, isolated from one another by the insulating edge cover 115. The edge cover 115 thus functions as an element isolation film as well.

<Production Method of the TFT Substrate 110>

The insulating substrate 111 can be made of, for example, alkali-free glass or plastic. Embodiment 1 employs an alkali-free glass substrate having a thickness of 0.7 mm.

A known photosensitive resin can be used for each of the interlayer insulating film 114 and the edge cover 115. Examples of such a known photosensitive resin encompass an acrylic resin and a polyimide resin.

Further, the TFTs 112 are fabricated by a known method. Embodiment 1 describes, as an example, the active matrix organic EL display device 100 in which the TFTs 112 are respectively formed in the pixels 101R, 101G and 101B, as described above.

However, Embodiment 1 is not limited to such a configuration. The present invention is also applicable to production of a passive matrix organic EL display device in which any TFT is not formed.

<Configuration of the Organic EL Elements 120>

The organic EL element 120 is a light-emitting element capable of high-luminance light emission based on low-voltage direct-current driving, and includes: the first electrode 121; the organic EL layer; and the second electrode 126, provided on top of one another in that order.

The first electrode 121 is a layer having the function of injecting (supplying) positive holes into the organic EL layer. The first electrode 121 is, as described above, connected to the TFTs 112 via the contact holes 114a.

The organic EL layer provided between the first electrode 121 and the second electrode 126 includes, for example, as shown in FIG. 6: a hole injection layer/hole transfer layer 122; luminescent layers 123R, 123G, and 123B; an electron transfer layer 124; and an electron injection layer 125, formed in that order from the first electrode 121 side.

Note that the organic EL layer can, as needed, further include a carrier blocking layer (not illustrated) for blocking a flow of carriers such as holes and electrons. Further, a single layer can have a plurality of functions. For example, a single layer that serves as both a hole injection layer and a hole transfer layer may be formed.

The above stack order intends to use (i) the first electrode 121 as an anode and (ii) the second electrode 126 as a cathode. The stack order of the organic EL layer is reversed in the case where the first electrode 121 serves as a cathode and the second electrode 126 serves as an anode.

The hole injection layer has the function of increasing efficiency in injecting positive holes into the organic EL layer from the first electrode 121. The hole transfer layer has the function of increasing efficiency in transferring positive holes to the luminescent layers 123R, 123G, and 123B. The hole injection layer/hole transfer layer 122 is so formed uniformly throughout the entire display region of the TFT substrate 110 as to cover the first electrode 121 and the edge cover 115.

Embodiment 1 is configured to involve, as the hole injection layer and the hole transfer layer, a hole injection layer/hole transfer layer 122 that integrally combines a hole injection layer with a hole transfer layer as described above. Embodiment 1 is, however, not limited to such a configuration. The hole injection layer and the hole transfer layer may be provided as separate layers independent of each other.

There are provided on the hole injection layer/hole transfer layer 122 the luminescent layers 123R, 123G, and 123B formed in correspondence with the respective pixels 101R, 101G, and 101B.

The luminescent layers 123R, 123G, and 123B are each a layer that has the function of emitting light by recombining (i) positive holes injected from the first electrode 121 side with (ii) electrons injected from the second electrode 126 side. The luminescent layers 123R, 123G, and 123B are each made of a material with high luminous efficiency, such as a low-molecular fluorescent dye and a metal complex.

The electron transfer layer 124 is a layer that has the function of increasing efficiency in transferring electrons to the luminescent layers 123R, 123G, and 123B. The electron injection layer 125 is a layer that has the function of increasing efficiency in injecting electrons from the second electrode 126 into the organic EL layer.

The electron transfer layer 124 is so provided on the luminescent layers 123R, 123G, and 123B and the hole injection layer/hole transfer layer 122 uniformly throughout the entire display region of the TFT substrate 110 as to cover the luminescent layers 123R, 123G, and 123B and the hole injection layer/hole transfer layer 122.

The electron injection layer 125 is so provided on the electron transfer layer 124 uniformly throughout the entire display region of the TFT substrate 110 as to cover the electron transfer layer 124.

The electron transfer layer 124 and the electron injection layer 125 may be provided either (i) as separate layers independent of each other as described above or (ii) integrally with each other. In other words, the organic EL display device 100 may include an electron transfer layer/electron injection layer instead of the electron transfer layer 124 and the electron injection layer 125.

The second electrode 126 is a layer having the function of injecting electrons into the organic EL layer including the above organic layers. The second electrode 126 is so provided on the electron injection layer 125 uniformly throughout the entire display region of the TFT substrate 110 as to cover the electron injection layer 125.

The organic layers other than the luminescent layers 123R, 123G, and 123B are not essential for the organic EL layer, and may thus be included as appropriate in accordance with a required property of the organic EL element 120.

Further, like the hole injection layer/hole transfer layer 122 and the electron transfer layer/electron injection layer, a single layer can have a plurality of functions.

The organic EL layer may further include a carrier blocking layer according to need. The organic EL layer can, for example, additionally include, as a carrier blocking layer, a hole blocking layer between the luminescent layers 123R, 123G, and 123B and the electron transfer layer 124 to prevent positive holes from transferring from the luminescent layers 23R, 23G, and 23B to the electron transfer layer 124 and thus to improve luminous efficiency.

<Method for Producing the Organic EL Element 120>

The first electrodes 121 are formed by (i) depositing an electrode material by a method such as sputtering and (ii) then patterning the electrode material in shapes for respective pixels 101R, 101G, and 101B by photolithography and etching.

The first electrodes 121 can be made of any of various electrically conductive materials. Note, however, that the first electrodes 121 need to be transparent or semi-transparent in a case where the organic EL display device 100 includes a bottom emission organic EL element in which light is emitted towards an insulating substrate 111 side.

Meanwhile, a second electrode 126 needs to be transparent or semi-transparent in a case where the organic EL display device 100 includes a top emission organic EL element in which light is emitted from a side opposite to the substrate side.

The conductive film material for each of the first electrode 121 and the second electrode 126 is, for example, (i) a transparent conductive material such as ITO (Indium Tin Oxide), IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method. For example, the vapor deposition apparatus 1 described later can be used for formation of layers of the first electrode 121.

The organic EL layer can be made of a known material. Note that each of the luminescent layers 123R, 123G, and 123B can be made of a single material or made of a host material mixed with another material as a guest material or a dopant.

The hole injection layer, the hole transfer layer, or the hole injection layer/hole transfer layer 122 can be made of a material such as (i) anthracene, azatriphenylene, fluorenone, hydrazone, stilbene, triphenylene, benzine, styryl amine, triphenylamine, porphyrin, triazole, imidazole, oxadiazole, oxazole, polyarylalkane, phenylenediamine, arylamine, or a derivative of any of the above, or (ii) a monomer, an oligomer, or a polymer of an open chain conjugated system or cyclic conjugated system, such as a thiophene compound, a polysilane compound, a vinylcarbazole compound, or an aniline compound.

The luminescent layers 123R, 123G, and 123B are each made of a material, such as a low-molecular fluorescent pigment or a metal complex, that has high light emission efficiency. For example, the luminescent layers 123R, 123G, and 123B are each made of a material such as anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, a derivative of any of the above, a tris(8-hydroxyquinolinate) aluminum complex, a bis(benzohydroxyquinolinate) beryllium complex, a tri(dibenzoylmethyl)

phenanthroline europium complex, dituluyl vinyl biphenyl, hydroxyphenyl oxazole, or hydroxyphenyl thiazole.

The electron transfer layer 124, the electron injection layer 125, or the electron transfer layer/electron injection layer can be made of a material such as a tris(8-hydroxyquinolinate) aluminum complex, an oxadiazole derivative, a triazole derivative, a phenylquinoxaline derivative, or a silole derivative.

<Method for Forming a Film Pattern by a Vacuum Vapor Deposition Method>

Figure 7:
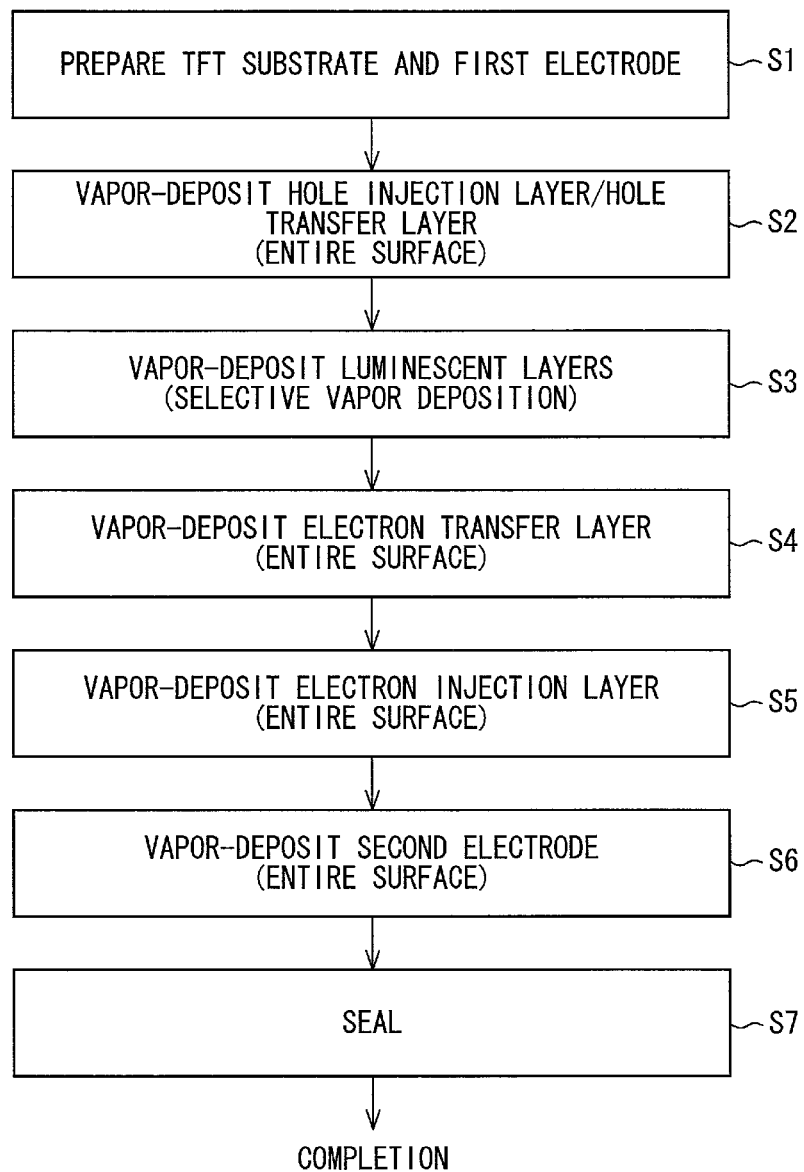
FIG. 7 is a flow chart showing a production process of an organic EL display device in the order of steps.

The following discusses a method for forming a film pattern by a vacuum vapor deposition method, mainly with reference to FIG. 7.

Note that the following description deals with an example case where: the TFT substrate 110 is used as the film formation target substrate 200; an organic luminescent material is used as the vapor deposition material; and an organic EL layer is formed as a vapor-deposited film, by the vacuum vapor deposition method, on the film formation target substrate 200 on which the first electrode 121 is formed.

As described above, the organic EL display device 100 that is a full-color organic display device includes, for example, the pixels 101R, 101G, and 101B arranged in a matrix manner, which pixels 101R, 101G, and 101B are respectively made of the organic EL elements 120 of red (R), green (G), and blue (B) that include the luminescent layers 123R, 123G, and 123B, respectively.

Note that the organic EL elements 120 may alternatively include, for example, luminescent layers of cyan (C), magenta (M), and yellow (Y), respectively, or luminescent layers of red (R), green (G), blue (B), and yellow (Y), respectively, in place of the luminescent layers 123R, 123G, and 123B of red (R), green (G), and blue (B).

Such an organic EL display device 100 performs a color image display by selectively causing the organic EL element 120 to emit light at a desired luminance by use of the TFTs 112.

Therefore, for producing the organic EL display device 100, it is required to form, on the film formation target substrate 200, the luminescent layers that are made of organic luminescent materials emitting respective colors. At this time, the luminescent layers each need to be formed in a predetermined pattern for each organic EL element 120.

As described above, in the mask 10, the apertures 11 each are formed in a desired shape at a desired position. As shown in FIGS. 1 through 3, the mask 10 is provided so as to face the film formation target surface 201 of the film formation target substrate 200 via a space of a predetermined distance.

On an opposite side of the mask 10 with respect to the film formation target substrate 200, the vapor deposition particle emitting device 30 is provided as a vapor deposition source so as to face the film formation target surface 201 of the film formation target substrate 200.

When the organic EL display device 100 is to be produced, the organic luminescent material is heated under high vacuum so that the organic luminescent material turned into gas by evaporation or sublimation, and then emitted from the vapor deposition particle emitting device 30 in the form of a gas of vapor deposition particles.

The vapor deposition material emitted as the vapor deposition particles from the vapor deposition particle emitting device 30 is vapor-deposited onto the film formation target substrate 200 through the apertures 11 provided in the mask 10.

This makes it possible to form, as a vapor-deposited film, an organic film having a desired film pattern only in a desired position, corresponding to each of the apertures 11, on the film formation target substrate 200. Note that the vapor deposition is separately carried out for each color of the luminescent layers (This is called a "selective vapor deposition").

For example, in case of the hole injection layer/hole transfer layer 122 as shown in FIG. 6, a film is formed throughout an entire area of the display section. Therefore, film formation is carried out by using, as the mask 10 for vapor deposition, an open mask that has an opening only in positions corresponding to the entire area of the display section and a region where film formation is required.

Note that the same applies to the electron transfer layer 124, the electron injection layer 125, and the second electrode 126.

Meanwhile, film formation is carried out for the luminescent layer 123R of a pixel in FIG. 6 that performs a red display, film formation is carried out by using, as the mask 10 for vapor deposition, a fine mask which has an opening only in a position corresponding to a region where a red luminescent material is to be vapor-deposited.

<Process Flow in Production of the Organic EL Display Device>

FIG. 7 is a flow chart showing a production process of the organic EL display device 100 in the order of steps.

First, the TFT substrate 110 is prepared. On thus prepared TFT substrate 110, the first electrode 121 is formed (step S1). Note that the TFT substrate 110 can be prepared by a known technique.

Then, on this TFT substrate 110 on which the first electrode 121 is formed, the hole injection layer and the hole transfer layer are formed throughout an entire pixel region by the vacuum vapor deposition method, with use of an open mask as the mask 10 for vapor deposition (step S2). Note that the hole injection layer and the hole transfer layer can alternatively be formed as the hole injection layer/hole transfer layer 122 as described above.

Next, selective vapor deposition of each of the luminescent layers 123R, 123G, and 123B is carried out by the vacuum vapor deposition method with use of a fine mask as the mask 10 for vapor deposition (step S3), whereby patterned films are formed so as to correspond to the pixels 101R, 101G, 101B, respectively.

Subsequently, on the TFT substrate 110 on which the luminescent layers 123R, 123G, and 123B are formed, the electron transfer layer 124, the electron injection layer 125, and the second electrode 126 each are formed in this order throughout the entire pixel region by the vacuum vapor deposition method, with use of an open mask as the mask 10 for vapor deposition (steps S4 to S6).

For the TFT substrate 110 on which vapor deposition has been completed as described above, sealing of a region (display section) of the organic EL elements 120 is performed so as to prevent the organic EL elements 120 from deteriorating due to moisture or oxygen in the air (step S7).

This sealing can be performed, for example, by a method in which a film that does not easily allow moisture and oxygen to pass through the film, or a method in which a glass substrate or the like is bonded with an adhesive or the like.

The organic EL display device 100 is prepared in the process as described above. Such an organic EL display device 100 causes current to flow into the organic EL elements 120 in respective individual pixels from an externally provided drive circuit so that the organic EL elements 120 emit light, whereby the organic EL display device 100 performs a desired display.

<Experimental Comparison Between Formed Film Patterns>

The following describes a result of comparison of accuracy between (i) a film pattern formed in the case where a pair of nozzle sections are provided as described above and (ii) a film pattern formed in a case where a pair of nozzle sections are not provided.

The following first schematically describes a configuration of a vapor deposition particle emitting device used for the comparison.

Figure 8:
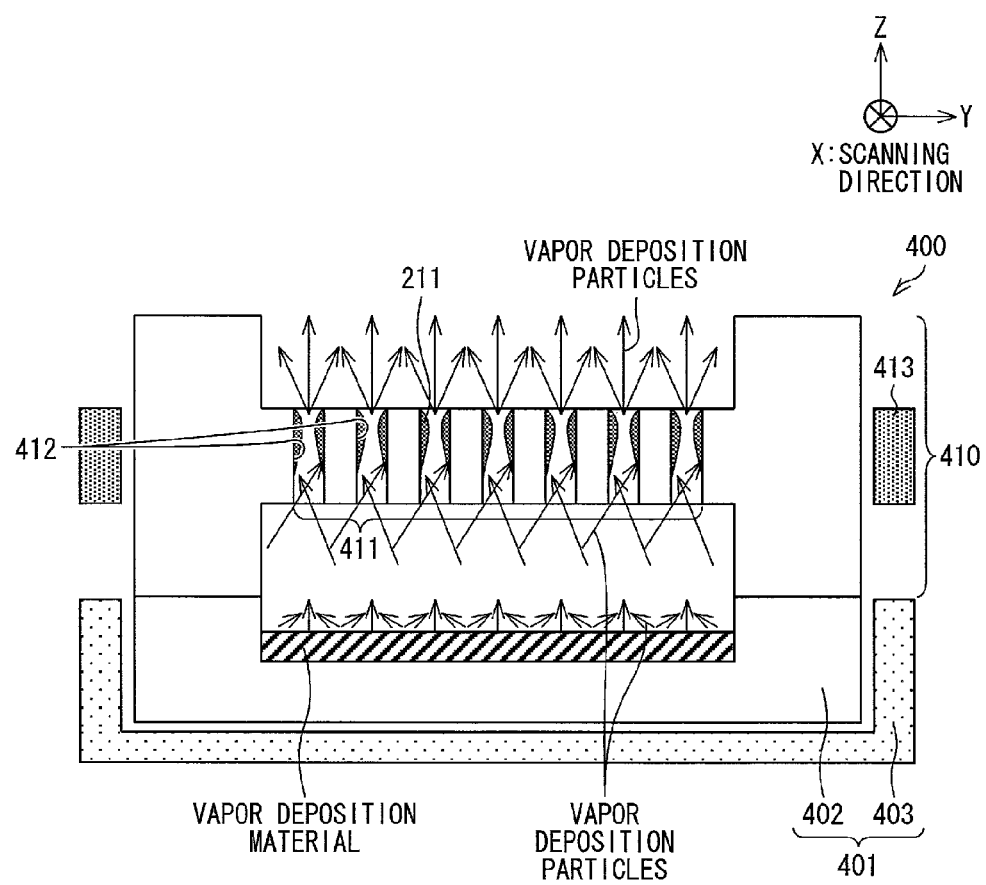
FIG. 8 is a cross-sectional view schematically showing a vapor deposition particle emitting device used for comparison of accuracy between formed film patterns.

FIG. 8 is a cross-sectional view schematically showing a configuration of a vapor deposition particle emitting device used for the comparison of accuracy between formed film patterns.

The vapor deposition particle emitting device 400 shown in FIG. 8 includes, as a nozzle section, only a cooled nozzle section instead of a pair of nozzle sections. Further, the vapor deposition particle emitting device 400 is not provided with a rolling mechanism.

The vapor deposition particle emitting device 400 includes, as a crucible section 401, a vapor deposition material supply unit including (i) a heating container 402 which contains a vapor deposition material and which is open at one surface (upper portion) and (ii) a heat exchanger 403 which is provided so as to surround the heating container 402 and which heats the vapor deposition material inside the heating container 402.

The vapor deposition particle emitting device 400 further includes, above the crucible section 401, a nozzle unit 410 which is adjacent to the crucible section 401 and which includes a cooled nozzle section 411.

The cooled nozzle section 411 is provided with a plurality of apertures 412 (through-holes) bored therethrough in the up-and-down direction. The vapor deposition particle emitting device 400 has a heat exchanger 413 provided in a region surrounding the apertures 412 of the cooled nozzle section 411. This heat exchanger 413 serves to adjust and control the temperature of the cooled nozzle section 411.

The cooled nozzle section 411 is provided inside the nozzle unit 410 so as to project in a direction perpendicular to respective aperture surfaces (nozzle surfaces) of the apertures 412 and to extend across the nozzle unit 410.

For an experiment, the vapor deposition particle emitting device 30 shown in FIG. 1 and the vapor deposition particle emitting device 400 described above were used as vapor deposition sources, and the comparison was carried out under an identical condition except for that point.

Note that a green luminescent material such as Alq$_3$ (aluminum quinolinol complex) (having a sublimation temperature of 305° C.) to be used for, for example, a host material of the green luminescent layer 123G was used as the vapor deposition material, and a single film of Alq$_3$ was in-line formed on a silicon wafer so as to have a thickness of 100 nm.

A separation distance between the film formation target substrate 200 and the mask 10 in the direction perpendicular to the film formation target surface 201 of the film formation target substrate 200 was set to 1 mm. Further, a separation distance between the vapor deposition particle emitting device 30 or 400 and the mask 10 in the direction perpendicular to the film formation target surface 201 of the film formation target substrate 200 was set to 125 mm.

An ultimate vacuum in the vacuum chamber 2 was set to be equal to or lower than $1.0 \times 10^{-4}$ Pa for each vapor deposition particle emitting device.

For the vapor deposition particle emitting device 30 shown in FIG. 1, the cooled nozzle section has its temperature set at 250° C., and the heated nozzle section and the crucible section 72 have their temperatures set at 330° C.

Similarly, for the vapor deposition particle emitting device 400 shown in FIG. 8, the cooled nozzle section 411 has its temperature set at 250° C., and the crucible section 401 has its temperature set to 330° C.

For each vapor deposition particle emitting device, each nozzle section has an aperture length (nozzle length) of 50 mm in a direction perpendicular to the film formation target surface 201 of the film formation target substrate 200.

Further, (i) the space extending between the cooled nozzle section and the heated nozzle section in the direction perpendicular to the film formation target surface 201 of the film formation target substrate 200 and (ii) the space extending between the cooled nozzle section 411 and the crucible section 401 in the same direction were each 20 mm so that none of the cooled nozzle section, the heated nozzle section, and the crucible section 401 would be influenced by any other in terms of temperature.

Figure 9:
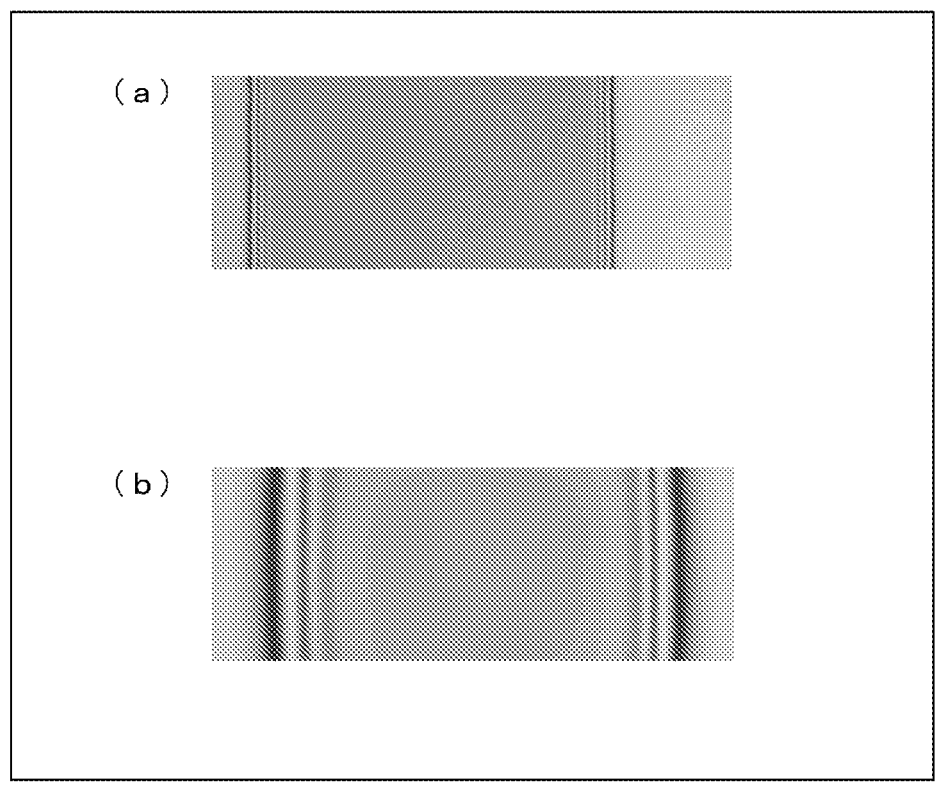
FIG. 9 is a set of diagrams (a) and (b), (a) showing an optical micrograph of a formed film pattern obtained by using, as a vapor deposition source, the vapor deposition particle emitting device shown in FIG. 1, and (b) showing an optical micrograph of a formed film pattern obtained by using, as a vapor deposition source, the vapor deposition particle emitting device shown in FIG. 8.

(a) and (b) of FIG. 9 show results of observation of obtained formed film patterns by use of an optical microscope.

(a) of FIG. 9 is a diagram showing an optical micrograph of a formed film pattern obtained by using, as a vapor deposition source, the vapor deposition particle emitting device 30 shown in FIG. 1; and (b) of FIG. 9 is a diagram showing an optical micrograph of a formed film pattern obtained by using, as a vapor deposition source, the vapor deposition particle emitting device 400 shown in FIG. 8.

In a case where a vapor deposition flow contains an oblique-flow component while passing through the apertures 11 in the mask 10, an obtained pattern has, in an end section of the obtained pattern, a sloping part (part in which film thickness is varying) formed by vapor deposition particles having obliquely passed through the apertures 11 in the mask 10.

In a case where the vapor deposition particle emitting device 400 is used as a vapor deposition source, as shown in (b) of FIG. 9, the part in which film thickness is varying can be seen as a multiplet in a width direction of the obtained pattern, and it is shown that a width of the part in which film thickness is varying, i.e., a width of a part which extends beyond an intended region where a film pattern is to be formed is much larger than that shown in (a) of FIG. 9.

Possible reasons for this are as follows:
The vapor deposition particle emitting device 400, as described above, (i) includes a cooled nozzle section 411 to serve as outward emission holes as described above to produce the effect of increasing the nozzle length, and also (ii) causes an oblique-flow component of vapor deposition particles to adhere to nozzle wall surfaces to collimate a vapor deposition flow.

In a case where the nozzle unit 410 is provided so as to be adjacent to the crucible section 401 as shown in FIG. 8, the cooled nozzle section 411 serving as outward emission holes is provided close to the heating container 402. In this case, the vapor deposition particles having been emitted from the vapor deposition particle emitting device 400 and having passed through apertures 11 (mask aperture pattern) in a mask 10 are scattered by the apertures 11 in the mask 10.

Thus, if the vapor deposition particle emitting device 400 is used as a vapor deposition source, blurring occurs in a formed film pattern, and it is not possible to form the film pattern with a predetermined accuracy.

The vapor deposition particle emitting device 400 further poses the following problem:
The vapor deposition particle emitting device 400, as described above, sets the temperature of the cooled nozzle section 411 to a temperature lower than the temperature at which vapor deposition particles turn into gas. This causes vapor deposition particles to adhere to nozzle wall surfaces as an adhering substance. Such an adhering substance having adhered to nozzle wall surfaces has a film thickness that is gradually increased as the time increases during which the vapor deposition particle emitting device 400 is used.

The above phenomenon results in a decreased in the film formation rate and/or unevenness in film thickness of a formed film pattern. Further, the adhering substance having adhered to nozzle wall surfaces clogs the cooled nozzle section. This problem is partly caused by a nozzle diameter reduced for improvement of a film thickness distribution.

As described above, a large pattern blur occurs in the obtained formed film pattern (see (b) of FIG. 9) in a case where the vapor deposition particle emitting device 400 is used as a vapor deposition source, whereas the pattern blur is reduced in (a) of FIG. 9 as compared to that in (b) of FIG. 9 (see (a) of FIG. 9) in a case where the vapor deposition particle emitting device 30 is used as a vapor deposition source.

This reveals that the use of the vapor deposition particle emitting device 30 of Embodiment 1 as a vapor deposition source makes it possible to produce a high quality display panel.

Further, in the case where the vapor deposition particle emitting device 30 according to Embodiment 1 is used as a vapor deposition source, causing the rotor 40 to rotate to replace a cooled nozzle section and a heated nozzle section with each other as described above can remove (re-evaporate or re-sublimate) an adhering substance 211 having adhered to nozzle wall surfaces.

It is so evident as to require no experimental proof that using the vapor deposition particle emitting device 30 as a vapor deposition source eliminates or inhibits such problems as an adhering substance 211 causing a decrease in the film formation rate, unevenness in film thickness, and/or clogging of nozzle sections as described above.

<Modification of the Substrate Moving Unit 3>

Note that Embodiment 1 has discussed, as an example with reference to the drawings, a case where the film formation target substrate 200 is placed on the substrate moving unit 3 (see FIG. 1). However, Embodiment 1 is not limited to such an example.

The substrate moving unit 3 preferably includes, for example, an electrostatic chuck (not illustrated). For example, in a case where a non-film-formation-target surface 202 of the film formation target substrate 200 is held, by use of a method such as an electrostatic chuck, by the substrate moving unit 3 provided on the non-film-formation-target surface 202 side of the film formation target substrate 200, the film formation target substrate 200 can be held by the substrate moving unit 3 without being bent by self weight.

<Other Modifications>

Note that FIG. 3 exemplifies a case where the apertures 11 in the mask 10 are arranged in a one-dimensional direction (i.e., in a line) and the emission holes of the vapor deposition particle emitting device 30 are also arranged in a one-dimensional direction. However, Embodiment 1 is not limited to such a case, and the apertures 11 in the mask 10 may be two-dimensionally (i.e., planarly) arranged and the emission holes of the vapor deposition particle emitting device 30 may also be two-dimensionally arranged.

Embodiment 1 has been described by taking, as an example, a case where (i) the organic EL display device 100 includes a TFT substrate 110 and (ii) an organic layer is formed on the TFT substrate 110. The present invention is, however, not limited to such an example. The present invention may alternatively be configured such that (i) the organic EL display device 100 includes not a TFT substrate 110 but, as a substrate on which an organic layer is to be formed, a passive substrate including no TFT, or that (ii) the film formation target substrate 200 is such a passive substrate.

Embodiment 1 has been described by taking as, an example, a case of, as described above, forming an organic layer on a TFT substrate 110. Embodiment 1 is, however, not limited to such an example. Embodiment 1 is suitably applicable to a case of forming an electrode pattern instead of an organic layer.

Note that, as a material of which the rotor 40 is made, a material which is free from deterioration and deformation caused by the heating or cooling may be selected as appropriate in accordance with a type of the vapor deposition material, particularly in accordance with a temperature at which the vapor deposition material turns into gas. Such a material is not specifically limited. The material of which the rotor 40 is made encompasses, for example, a material of which a publicly-known vapor deposition source such as a crucible is made.

The vapor deposition particle emitting device 30 and the vapor deposition apparatus 1, and the vapor deposition method according to Embodiment 1 are, as described above, suitably applicable to not only the method for producing the organic EL display device 100 but also any production method and production device for forming a patterned film by vapor deposition.

For example, the vapor deposition particle emitting device and the vapor deposition apparatus 1, and the vapor deposition method according to Embodiment 1 are suitably applicable not only to the organic EL display device 100 but also to, for example, production of a functional device such as an organic thin-film transistor.

Embodiment 2

Embodiment 2 is described below mainly with reference to FIG. 10.

Embodiment 2 mainly deals with how Embodiment 2 is different from Embodiment 1 above. Constituent elements of Embodiment 2 that are identical in function to their respective equivalents described in Embodiment 1 are each assigned the same reference numeral, and are not described here.

Embodiment 1 has discussed, as an example, a case where the rotor 40 has one pair of nozzle sections that are provided symmetrically facing each other with the space in the rotor 40 therebetween, one of the nozzle sections being used as a cooled nozzle section and the other as a heated nozzle section.

Such a pair of nozzle sections may alternatively be provided in a number of two or more.

Figure 10:
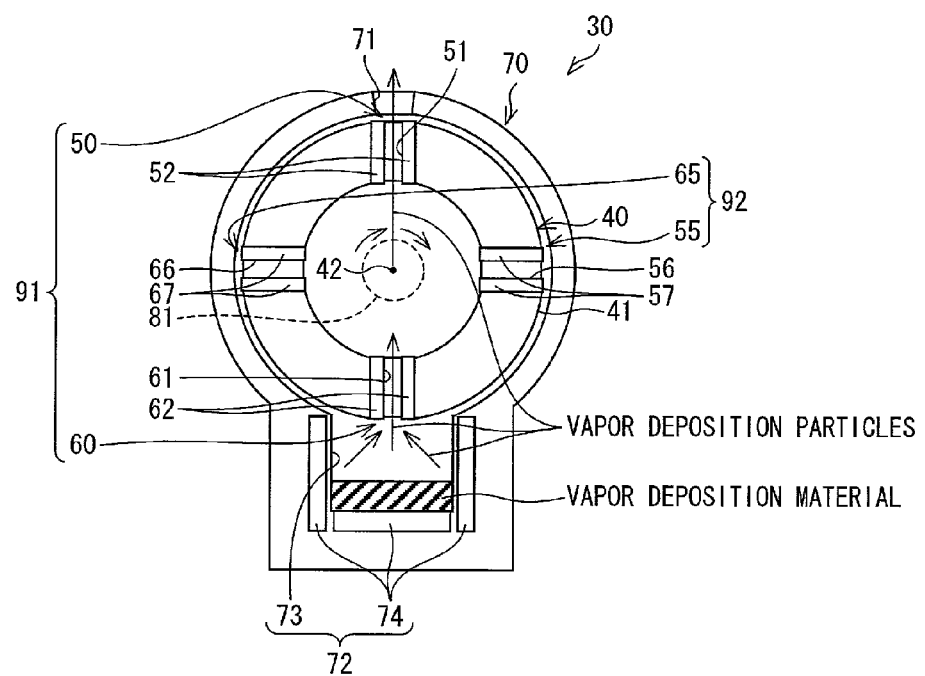
FIG. 10 is a cross-sectional view schematically showing a configuration of a vapor deposition particle emitting device according to Embodiment 2 of the present invention.

FIG. 10 is a cross-sectional view schematically showing a configuration of a vapor deposition particle emitting device 30 according to Embodiment 2.

FIG. 10 schematically shows a configuration of the vapor deposition particle emitting device 30 in a cross-section thereof taken along line B-B of FIG. 3, that is, a configuration of the vapor deposition particle emitting device 30 in a cross-section thereof taken along a direction perpendicular to the cylindrical axis 42 of the rotor 40.

A cross-sectional schematic configuration of the vapor deposition particle emitting device 30 as taken along line A-A of FIG. 3, i.e., a cross-sectional schematic configuration of the vapor deposition particle emitting device 30 as taken along the direction of the cylindrical axis of the rotor 40 is identical to a cross-sectional schematic configuration of the vapor deposition particle emitting device 30 shown in FIG. 1.

FIG. 10 illustrates an example where the rotor 40 is provided with (i) a first nozzle section pair 91 (first pair of nozzle sections) including a first nozzle section 50 and a second nozzle section 60 and (ii) a second nozzle section pair 92 (second pair of nozzle sections) including a third nozzle section 55 and a fourth nozzle section 65.

The first nozzle section pair 91 and the second nozzle section pair 92 are identical to each other in shape and structure.

Thus, the third nozzle section 55 has apertures 56 (through-holes), whereas the fourth nozzle section 65 has apertures 66 (through-holes), the apertures 56 and the apertures 66 being aligned in the direction of the cylindrical axis and provided symmetrically facing each other with the space in the rotor 40 therebetween.

Similarly to the apertures 51 and 61, each of the apertures 56 appears to correspond in center position (aperture center) to a corresponding one of the apertures 66 when viewed from an angle perpendicular to the aperture surfaces.

Further, the third nozzle section 55 is provided therein with a heat exchanger 57 that is provided in a region surrounding each of the apertures 56. This heat exchanger 57 serves as a temperature adjustment member that adjusts and controls a temperature of the third nozzle section 55.

The fourth nozzle section 65 is provided therein with a heat exchanger 67 that is provided in a region surrounding each of the apertures 66. This heat exchanger 67 serves as a temperature adjustment member that adjusts and controls a temperature of the third nozzle section 65.

The crucible section 72 is configured as described above.

This allows the first nozzle section 50, the second nozzle section 60, the third nozzle section 55, the fourth nozzle section 65, and the crucible section 72 to adjust and control their respective temperatures independently of each other.

The first nozzle section pair 91 and the second nozzle section pair 92 are placed at a predetermined interval from each other around the cylindrical axis 42, which serves as an axis of rotation (center of rotation) of the rotor 40, with the cylindrical axis 42 as the center.

In other words, (i) the nozzle sections constituting the first nozzle section pair 91 and (ii) those constituting the second nozzle section pair 92 are alternately placed at the predetermined interval around the cylindrical axis 42 of the rotor 40.

In FIG. 10, the first nozzle section 50, the third nozzle section 55, the second nozzle section 60, and the fourth nozzle section 65 are provided clockwise in this order at regular intervals.

Therefore, the first nozzle section 50, the third nozzle section 55, the second nozzle section 60, and the fourth nozzle section 65 are provided around the cylindrical axis 42 of the rotor 40 at an angle of 90 degrees to each other, and the apertures of the first nozzle section pair extend in a direction angled at 90 degrees to the direction in which the apertures of the second nozzle section pair extend.

The first nozzle section pair 91 and the second nozzle section pair 92 are held by the rolling mechanism 80 such that either one of the nozzle sections in either one of the nozzle section pairs faces the apertures 71 of the vapor deposition particle leakage prevention member 70.

FIG. 10 shows a case where (i) the first nozzle section 50 of the first nozzle section pair is held to face the apertures 71 and (ii) the second nozzle section 60 of the first nozzle section pair is held to face the crucible section 72.

As in Embodiment 1, Embodiment 2 uses, (i) as a cooled nozzle section, a nozzle section which faces the outside and which serves as outward emission holes in the vapor deposition particle emitting device 30 and, (ii) as a heated nozzle section, a nozzle section paired with the above nozzle section.

Embodiment 2 is, as described above, configured such that the rotor 40 includes a plurality of pairs of nozzle sections at predetermined intervals with the cylindrical axis 42, which serves as a rotating shaft of the rotor 40, as the center. With this configuration, while one pair of nozzle sections are in use, the other pairs of nozzle sections can each change its temperature.

The foregoing configuration can thus reduce the time necessary for the cooled nozzle section and the heated nozzle section to each have a stable temperature after the rolling mechanism 80 finishes an operation of causing the rotor 40 to rotate.

The vapor deposition particle leakage prevention member 70, which has apertures 71 only on one side, functions as a shutter for the nozzle sections other than the nozzle section facing the apertures 71.

Embodiment 2 may, needless to say, be configured such that (i) the vapor deposition particle leakage prevention member 70 is replaced or accompanied by shutters openably and closably provided for the apertures of each nozzle section and that (ii) the vapor deposition particle emitting device 30 controls opening and closing of each shutter so that only the apertures of cooled nozzles serving as outward emission holes are opened while the other apertures are closed.

Embodiment 2 is, as described above, configured such that the first nozzle section pair 91 and the second nozzle section pair 92 are identical to each other in shape and structure. It is thus needless to say that carrying out vapor deposition with use of the first nozzle section pair and the second nozzle section pair can produce experimental results and advantages similar to those produced in Embodiment 1.

<Modification>

Embodiment 2 has been described by taking, as an example, a case where as described above, the rotor 40 includes a total of two pairs of nozzle sections provided around the cylindrical axis 42 of the rotor 40 with the cylindrical axis 42 as the center such that the two pairs of nozzle sections are provided at an angle of 90 degrees to each other.

Embodiment 2 is, however, not limited to the above configuration, and may alternatively be configured such that for example, the rotor 40 includes a total of three pairs of nozzle sections and that the three pairs of nozzle sections are provided at an angle of 60 degrees to each other. The rotor 40 may further alternatively include not less than three pairs of nozzle sections.

Embodiment 3

Embodiment 3 is described below mainly with reference to FIGS. 11 through 14.

Embodiment 3 mainly deals with how Embodiment 3 is different from Embodiments 1 and 2 above. Constituent elements of Embodiment 3 that are identical in function to their respective equivalents described in Embodiments 1 and 2 are each assigned the same reference numeral, and are not described here.

Figure 11:
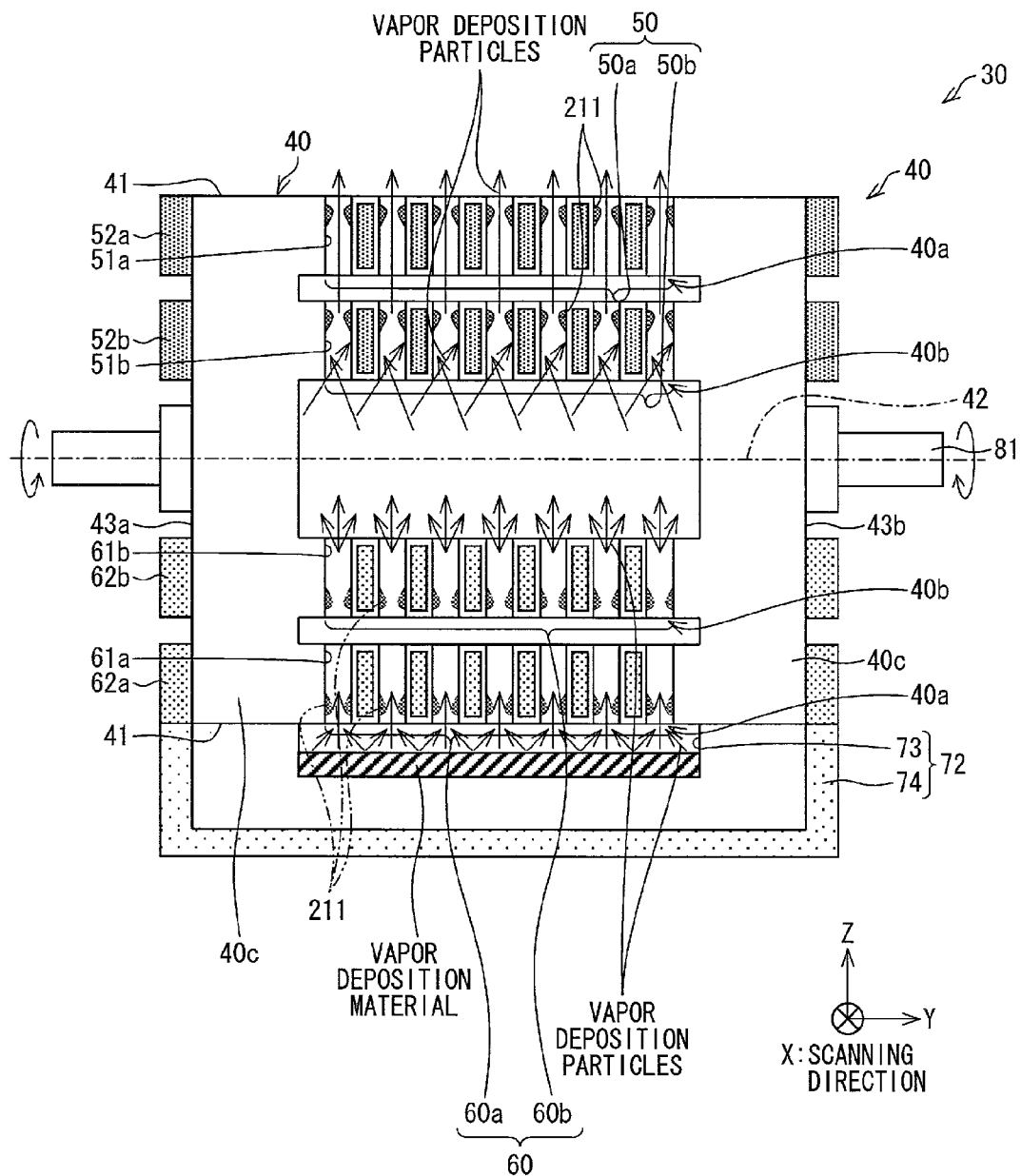
FIG. 11 is a cross-sectional view schematically showing a configuration of a main part of a vapor deposition particle emitting device according to Embodiment 3 of the present invention.
Figure 12:
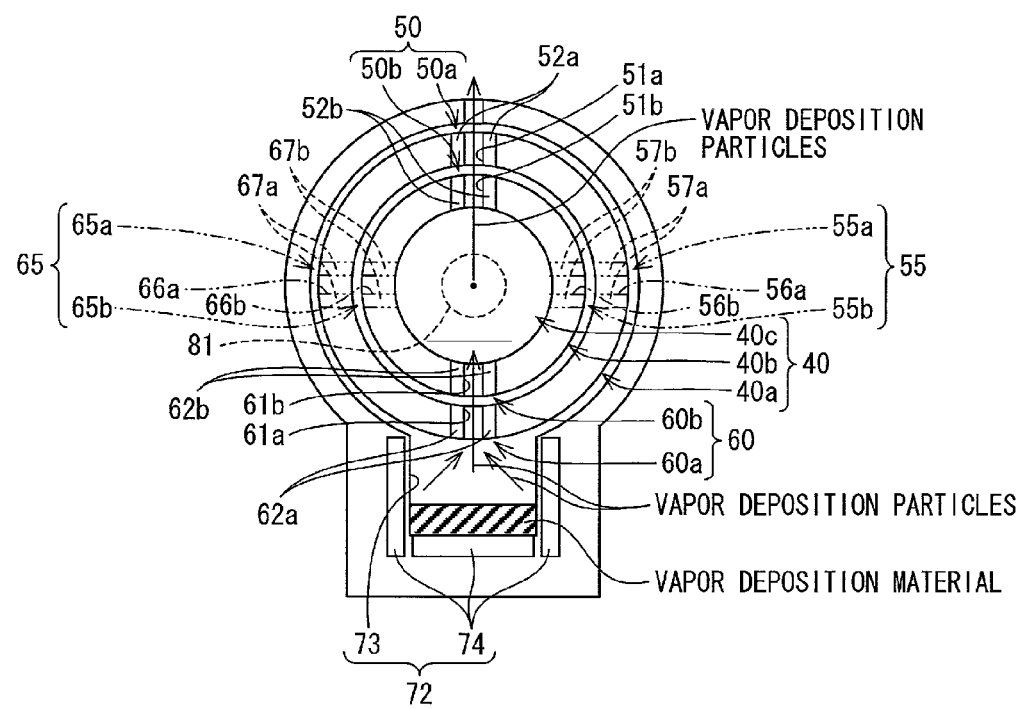
FIG. 12 is a cross-sectional view schematically showing a configuration of a main part of another vapor deposition particle emitting device according to Embodiment 3 of the present invention.

FIGS. 11 and 12 are each a cross-sectional view schematically showing a configuration of a vapor deposition particle emitting device 30 according to Embodiment 3.

FIG. 11 schematically shows a configuration of the rotor 40 in a cross-section thereof taken along the cylindrical axis. FIG. 12 schematically shows a configuration of the rotor 40 in a cross-section thereof taken along the direction perpendicular to the cylindrical axis.

The vapor deposition particle emitting device 30 according to Embodiment 3 is similar in operating principle to the vapor deposition particle emitting device 30 according to Embodiment 1.

The vapor deposition particle emitting device 30 according to Embodiment 3, however, differs from the vapor deposition particle emitting device 30 according to Embodiment 1 in that each of the nozzle sections in each pair, that is, each of the paired nozzle sections of each nozzle section pair, includes multi-tiered nozzle sections.

In other words, the rotor 40 of the vapor deposition particle emitting device 30 includes multi-tiered cooled nozzle sections and multi-tiered heated nozzle sections.

Embodiment 3 is configured such that as indicated by solid lines in FIGS. 11 and 12, the first nozzle section 50, which, of the pair of nozzle sections facing each other with the cylindrical axis 42 (which serves as a center of rotation of the rotor 40) therebetween, is located facing the apertures 71 of the vapor deposition particle leakage prevention member 70, includes two-tiered nozzle sections, namely a nozzle section 50a and a nozzle section 50b.

Meanwhile, the second nozzle section 60, which is located across the cylindrical axis 42 from the first nozzle section 50, includes two-tiered nozzle sections, namely a nozzle section 60a and a nozzle section 60b.

As shown in FIG. 12, the rotor 40 has a double-tube structure including an outer tube 40a (first cylindrical tube) and an inner tube 40b (second cylindrical tube) provided inside the outer tube 40a.

As shown in FIGS. 11 and 12, the outer tube 40a and the inner tube 40b each have a plurality of apertures (throughholes) bored therethrough and arranged along the cylindrical axis when viewed from an angle perpendicular to the film formation target surface 201 of the film formation target substrate 200.

The outer tube 40*a* and the inner tube 40*b* are each provided with nozzle sections each having a plurality of apertures, the nozzle sections facing each other with the cylindrical axis 42, which serves as a center of rotation of the rotor 40, therebetween.

The outer tube 40*a* is provided with a pair of nozzle sections 50*a* and 60*a* as the nozzle sections. The nozzle sections 50*a* and 60*a* are provided symmetrically facing each other, and have a group of apertures 51*a* and a group of apertures 61*a*, respectively, facing each other with the cylindrical axis 42 therebetween.

The inner tube 40*b* is provided with a pair of nozzle sections 50*b* and 60*b* as the nozzle sections. The nozzle sections 50*b* and 60*b* are provided symmetrically facing each other, and have a group of apertures 51*b* and a group of apertures 61*b*, respectively, facing each other with the cylindrical axis 42 therebetween.

The nozzle sections 50*a*, 50*b*, 60*a*, and 60*b* are placed one above the other at a distance from each other along the direction in which the apertures 51*a*, 51*b*, 61*a*, and 61*b* extend.

The nozzle sections 50*a*, 50*b*, 60*a*, and 60*b* are identical to each other in shape and structure.

The apertures 51*a*, 51*b*, 61*a*, and 61*b*, which are provided one above the other, appear to correspond in center position (aperture center) to each other when viewed from an angle perpendicular to the aperture surfaces.

Further, the nozzle section 50*a* is provided therein with a heat exchanger 52*a* that is provided in a region surrounding each of the apertures 51*a*. This heat exchanger 52*a* serves as a temperature adjustment member that adjusts and controls a temperature of the nozzle section 50*a*.

The nozzle section 50*b* is provided therein with a heat exchanger 52*b* that is provided in a region surrounding each of the apertures 51*b*. This heat exchanger 52*b* serves as a temperature adjustment member that adjusts and controls a temperature of the nozzle section 50*b*.

The nozzle section 60*a* is provided therein with a heat exchanger 62*a* that is provided in a region surrounding each of the apertures 61*a*. This heat exchanger 62*a* serves as a temperature adjustment member that adjusts and controls a temperature of the nozzle section 60*a*.

The nozzle section 60*b* is provided therein with a heat exchanger 62*b* that is provided in a region surrounding each of the apertures 61*b*. This heat exchanger 62*b* serves as a temperature adjustment member that adjusts and controls a temperature of the nozzle section 60*b*.

The crucible section 72 is configured as described above.

This allows the nozzle sections 50*a*, 50*b*, 60*a*, and 60*b* and the crucible section 72 to adjust and control their respective temperatures independently of each other.

The nozzle sections 50*a*, 50*b*, 60*a*, and 60*b* and the crucible section 72 may thus differ from each other.

Of each pair of nozzle sections facing each other with the cylindrical axis 42 therebetween, (i) one (the nozzle sections 50*a* and 50*b* in FIGS. 11 and 12) located facing the apertures 71 of the vapor deposition particle leakage prevention member 70 is adjusted to have a temperature lower than the temperature at which the vapor deposition material turns into gas, and (ii) the other (the nozzle sections 60*a* and 60*b* in FIGS. 11 and 12) is adjusted to have a temperature equal to or higher than the temperature at which the vapor deposition material turns into gas.

Embodiment 3 is configured to produce a rotor 40 with multiple-tiered nozzle sections by, for instance, (i) combining a plurality of cylindrical tubes (the outer tube 40*a* and the inner tube 40*b* in FIGS. 11 and 12) that, as described above, differ from each other in diameter and each have apertures as shown in FIGS. 11 and 12, thereby preparing a multiple tube (a double tube in FIGS. 11 and 12), (ii) attaching, to an end face of the multiple tube, a cap section 40*c* for fixing the multiple tube, the cap section 40*c* being configured to, for example, include a groove section (not shown) by which the cap section 40*c* is fitted in the cylindrical tubes, and (iii) fixing the rotating shaft 81 to the cap section 40*c*.

Embodiment 3, in which both the cooled nozzle sections and the heated nozzle sections have a multiple-tiered structure as described above, can improve a collimation characteristic of the vapor deposition flow.

Providing multi-tiered cooled nozzle sections as described above can increase a tolerable amount of the adhering substance 211 (vapor deposition particles) having adhered to the cooled nozzle sections.

The foregoing configuration consequently allows a longer interval between instances of replacement of the cooled nozzle sections and the heated nozzle sections with each other.

<Experimental Comparison of Formed Film Patterns>

Next, for comparison, FIG. 13 shows a result obtained by actually forming a film pattern as in the case of Embodiment 1 by using, as a vapor deposition source, the vapor deposition particle emitting device 30 shown in FIGS. 11 and 12.

FIG. 13 is a diagram showing an optical micrograph of a formed film pattern obtained by using the vapor deposition particle emitting device 30 shown in FIGS. 11 and 12.

Note that for an experiment, the vapor deposition particle emitting device 30 shown in FIGS. 11 and 12 (described earlier) was used as a vapor deposition source and that a comparison was made under a condition identical to the condition used in <Experimental Comparison of Formed Film Patterns> of Embodiment 1, except that changes were made as shown below.

That is, Embodiment 3 is configured such that assuming that the nozzle sections are named a first heated nozzle section, a second heated nozzle section, a second cooled nozzle section, and a first cooled nozzle section in the order from the crucible section 72 side, (i) the crucible section 72 and the first heated nozzle section have their temperatures set at 330° C., (ii) the second heated nozzle section has its temperature set at 325° C., (iii) the second cooled nozzle section has its temperature set at 270° C., and (iv) the first cooled nozzle section has its temperature set at 250° C.

That is, with the placement indicated by the solid lines in FIGS. 11 and 12, (i) the nozzle section 60a has its temperature set at 330° C., (ii) the nozzle section 60b has its temperature set at 325° C., (iii) the nozzle section 50b has its temperature set at 270° C., and (iv) the nozzle section 50a has its temperature set at 250° C.

Each nozzle section (namely, the nozzle sections 50a, 50b, 60a, and 60b) has an aperture length (nozzle length) of 50 mm in a direction perpendicular to the film formation target surface 201 of the film formation target substrate 200.

Further, (i) the space extending between the cooled nozzle section and the heated nozzle section in the direction perpendicular to the film formation target surface 201 of the film formation target substrate 200 and (ii) the space extending between the cooled nozzle section 411 and the crucible section 401 in the same direction were each 20 mm so that none of the cooled nozzle sections, the heated nozzle sections, and the crucible section 401 would be influenced by any other in terms of temperature.

The space extending between the nozzle section 50b and the nozzle section 60b in the direction perpendicular to the film formation target surface 201 of the film formation target substrate 200, that is, the space between the second cooled nozzle section and the second heated nozzle section (the space being equal to the inner tube diameter [aperture diameter] of the inner tube 40b), is 20 mm.

Further, both (i) the space between the nozzle section 50a and the nozzle section 50b and (ii) the space between the nozzle section 60a and the nozzle section 60b, that is, both (i) the space between the first cooled nozzle section and the second cooled nozzle section and (ii) the space between the first heated nozzle section and the second heated nozzle section (the spaces being each equal to the space between the outer tube 40a and the inner tube 40b), is each 10 mm.

Figure 13:
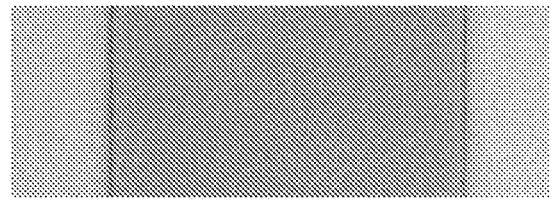
FIG. 13 is a diagram showing an optical micrograph of a formed film pattern obtained by using the vapor deposition particle emitting device as shown in FIG. 11 or 12.

As shown in FIG. 13, Embodiment 2 makes it possible to obtain a formed film pattern in which a pattern blur is further suppressed than in the case of Embodiment 1 and almost no pattern blur occurs. This reveals that Embodiment 2 makes it possible to form a higher-definition display panel.

Further, in Embodiment 3, as described above, the nozzle sections 50a, 50b, 60a, and 60b have their temperatures adjusted and controlled so that an outer one of the nozzle sections is lower in temperature than an inner one of the nozzle sections.

The first cooled nozzle section and the second cooled nozzle section may, as described above, have their temperatures controlled to be different from each other or equal to each other. The first heated nozzle section and the second heated nozzle section may, as described above, have their temperatures controlled to be different from each other or equal to each other.

As described above, however, Embodiment 3 is provided with, in a path through which vapor deposition particles are released, multi-tiered aperture sections (nozzle sections) through which the vapor deposition particles pass, and thereby makes a stepwise change in temperature of the nozzle sections (gradually lowers the temperatures of the nozzle sections) during collimation of the vapor deposition flow. This makes it possible to linearize a flow of the vapor deposition particles and thereby to reduce the vapor deposition material that adheres to respective wall surfaces of the nozzle sections.

Further, as described above, the temperature of the nozzle sections is gradually lowered from an upstream side to a downstream side of the injection path for the vapor deposition particles. This makes it possible to gradually reduce the temperature of the vapor deposition particles that pass through each of the plurality of nozzle stages made of the respective nozzle sections.

Consequently, this makes it possible to locally reduce a pressure at the apertures in the first cooled nozzle section which apertures serve as the emission holes of the vapor deposition particle emitting device 30. This makes it possible to more effectively prevent the vapor deposition particles from being scattered at the apertures.

Further, changing the respective temperatures of the nozzle sections stepwise (that is, gradually lowering the respective temperatures of the nozzle sections) as described above can lower the pressure in the first cooled nozzle section, and thus reduce scattering of vapor deposition particles at the first cooled nozzle section.

Furthermore, because the pressure in and in the vicinity of the cooled nozzle section is reduced as described above, it is possible to prevent a phenomenon in which a mean free path of the vapor deposition particles becomes shorter. This allows a further improvement in collimation characteristic of a vapor deposition flow.

In the case where the cooled nozzle sections are cooled and an oblique-flow component of vapor deposition particles is thus caused to adhere to nozzle wall surfaces so that a straight travelling characteristic of vapor deposition particles is enhanced as described above, if (i) multi-tiered nozzle sections are not provided unlike the foregoing configuration or if (ii) even with multi-tiered nozzle sections provided, the respective temperatures of the nozzle sections are not changed and the temperature of the cooled nozzle section facing outward is lowered at once so that the temperature of the vapor deposition flow is lowered at once, a larger amount of vapor deposition particles will adhere to a nozzle wall surface of the cooled nozzle section.

In contrast, providing multi-tiered nozzle sections as described above and changing the respective temperatures of the nozzle sections stepwise (that is, gradually lowering the respective temperatures of the nozzle sections) can, as described above, not only increase a tolerable amount of the adhering substance 211 (vapor deposition particles) having adhered to the cooled nozzle sections, but also reduce the amount of vapor deposition particles having adhered to nozzle wall surfaces of the cooled nozzle sections.

The foregoing configuration consequently allows an even longer interval between instances of replacement of the cooled nozzle sections and the heated nozzle sections with each other.

<Modification of the Rotor 40>

As described above, Embodiment 3 has been described mainly by taking, as an example, a case where the rotor 40 is provided with nozzle sections 50a and 50b as the nozzle section 50 and nozzle sections 60a, and 60b as the second nozzle section 60.

However, Embodiment 3 is not limited to this configuration, and may alternatively be configured such that the rotor 40 further includes a third nozzle section 55 and a fourth nozzle section 65 in addition to the first nozzle section 50 and the second nozzle section 60 as indicated by chain double-dashed lines in FIG. 12.

That is, the rotor 40 may further include, as nozzle sections, (i) a nozzle section 55a provided with apertures 56a and a heat exchanger 57a, (ii) a nozzle section 55b provided with apertures 56b and a heat exchanger 57b, (iii) a nozzle section 65a provided with apertures 66a and a heat exchanger 67a, and (iv) a nozzle section 65b provided with apertures 66b and a heat exchanger 67b.

The foregoing configuration makes it possible to achieve, in addition to the aforementioned effects, the effects described in Embodiment 2.

<Other Modifications>

Figure 14:
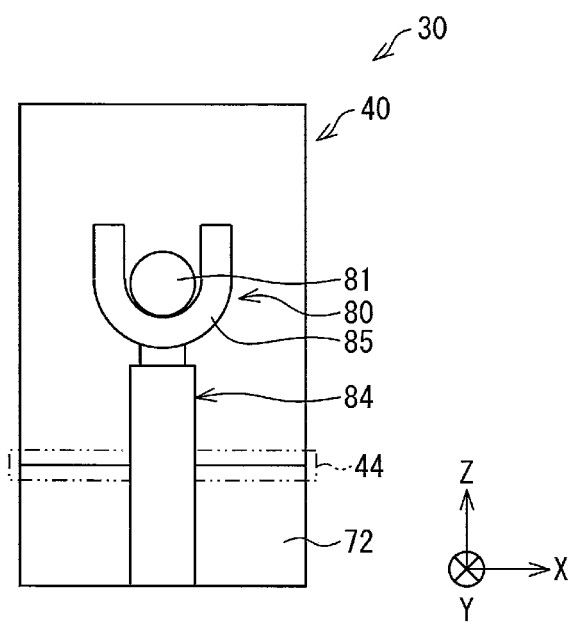
FIG. 14 is a side view schematically showing an example of a configuration of a main part of a vapor deposition particle emitting device according to Embodiment 3 of the present invention.

FIG. 14 is a side view schematically showing an example of a main part of a vapor deposition particle emitting device 30 according to Embodiment 3.

Embodiment 3, as well as Embodiments 1 and 2, has been described, as an example, a case where the rotor 40 has a cylindrical shape and is separated from the vapor deposition particle leakage prevention member 70 by a very small space of approximately 1 mm so that the rotor 40 is caused to rotate.

The shape of the rotor 40 is, however, not limited to a cylindrical shape. The rotor 40 may alternatively be in the shape of, for example, an angular cylinder (hollow prism) as shown in FIG. 14.

In this case, the rotor 40 can be provided with a nozzle section pair having a cross-sectional configuration similar to that shown in FIG. 1 in a case where, for instance, (i) the rotor 40 has a top wall and a bottom wall each provided with a plurality of apertures (through-holes) bored thorough a corresponding one of the top wall and the bottom wall along the axis direction of the rotating shaft 81 provided to an end face of the rotor 40 and (ii) a heat exchanger is provided in the vicinity of the apertures.

The rotor 40 can be provided with multi-tiered nozzle sections having a cross-sectional configuration similar to that shown in FIG. 11 in a case where the rotor 40 has provided therein a plurality of (that is, multi-tiered) nozzle sections each projecting in the shape of a shelf along the axial direction of the rotating shaft 81, the nozzle sections being provided one above the other at predetermined intervals from each other.

In a case where the rotor 40 has provided therein multi-tiered nozzle sections as shown in FIG. 11, the rotor 40 may be configured such that each nozzle section is in the form of a unit and that a plurality of units are connected to each other. There is no particular limit to how the units are connected to each other. Further, the crucible section 72 may similarly be in the form of a unit.

In a case where the rotor 40 is in the shape of, for example, an angular cylinder as described above, the rotor 40 may be raised by an actuator 84 for rotation with use of, for example, configurations in which (i) the rolling mechanism 80 further includes, as shown in FIG. 14, an actuator 84 (raising and lowering mechanism) provided so as to be extendable along the direction in which the apertures of the nozzle sections extend, (ii) the rotary drive section 82 (see FIG. 4) includes a rotating shaft drive section (for example, a motor) for driving the rotating shaft 81 and an actuator drive section (for example, a motor) for driving the actuator 84, and (iii) the actuator 84 is provided with a retaining section 85 for retaining the rotating shaft 81.

The foregoing configuration allows replacement of the cooled nozzle sections and the heated nozzle sections with each other.

In a case where Embodiment 3 is configured such that the rotor 40 is raised by an actuator 84 for rotation to replace the cooled nozzle sections and the heated nozzle sections with each other as described above, there is desirably no space in a boundary section between the rotor 40 and the actuator 84. In a case where there is a space therebetween, a trap 44 (vapor deposition particle trapping section) for trapping vapor deposition particles may be provided to either the rotor 40 or the crucible section 72 in correspondence with a boundary section (space) between the rotor 40 and the crucible section 72 as indicated by a chain double-dashed line in FIG. 14.

Note that in view of efficient trapping of the vapor deposition particles, the trap 44 is preferably cooled by a heat exchanger (not illustrated).

Embodiment 4

Embodiment 2 is described below mainly with reference to FIGS. 15 through 17.

Embodiment 4 mainly deals with how Embodiment 4 is different from Embodiments 1 through 3 above. Constituent elements of Embodiment 4 that are identical in function to their respective equivalents described in Embodiments 1 through 3 are each assigned the same reference numeral, and are not described here.

<Configuration of the Vapor Deposition Particle Emitting Device 30>

Figure 15:
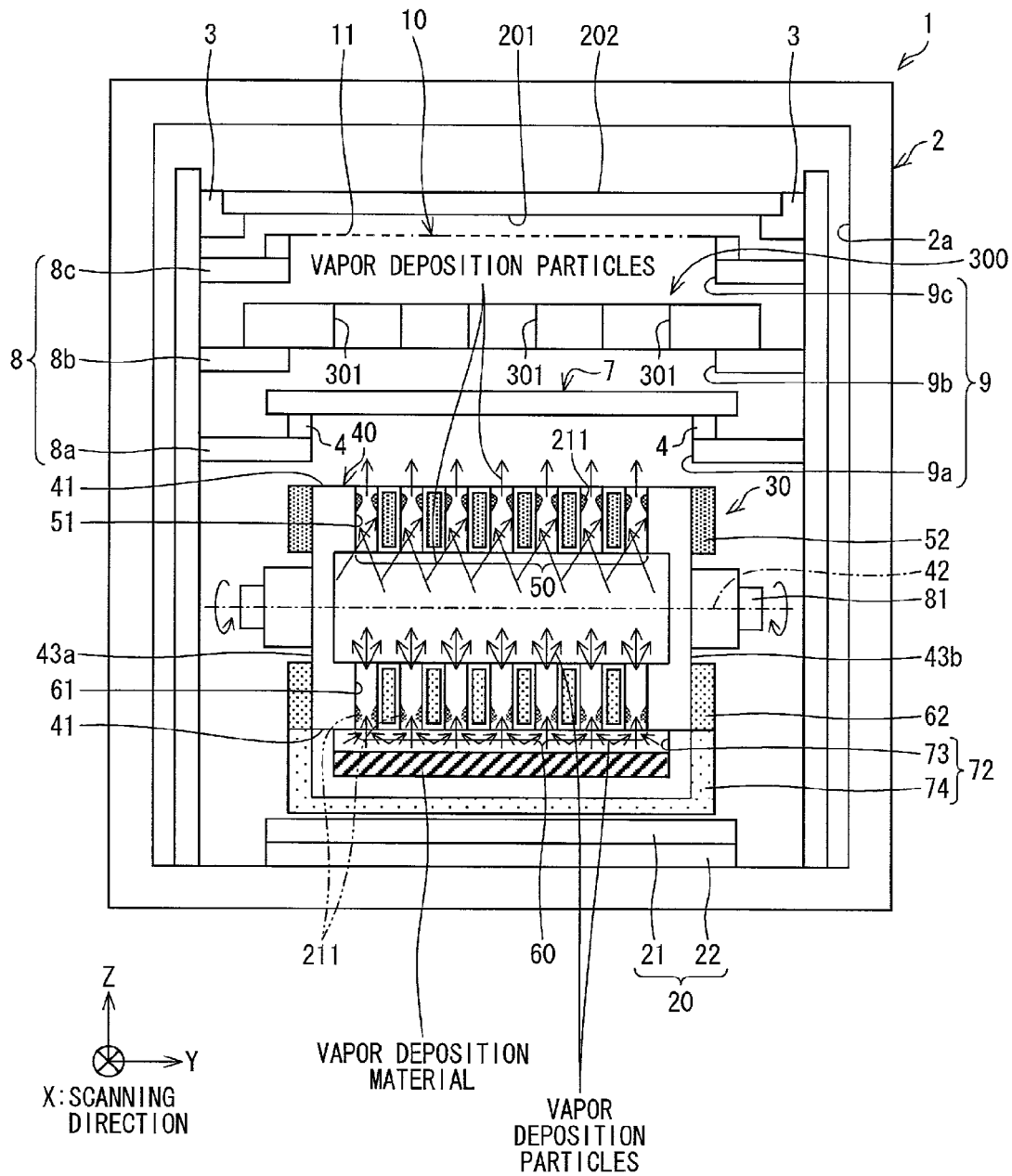
FIG. 15 is a cross-sectional view schematically showing main components in a vacuum chamber of a vapor deposition apparatus according to Embodiment 4 of the present invention.

FIG. 15 is a cross-sectional view schematically showing main components in a vacuum chamber 2 of a vapor deposition apparatus 1 according to Embodiment 3. FIG. 16 is a cross-sectional view schematically showing a configuration of a main part of the vapor deposition apparatus 1 according to Embodiment 3.

The vapor deposition apparatus 1 according to Embodiment 4 is similar in configuration to the vapor deposition apparatus 1 of Embodiment 1, except that the vapor deposition apparatus 1 according to Embodiment 3 includes a limiting board 300 (apertures) which is provided between a mask 10 and a vapor deposition particle emitting device 30.

Therefore, only the limiting board 300 will be described below as a configuration of the vapor deposition apparatus 1 according to Embodiment 4.

<Configuration and Effect of the Limiting Board 300>

Embodiment 4 uses, as a vapor deposition source, the vapor deposition particle emitting device 30 similar to that of Embodiment 1. However, in a case where a collimation characteristic of a vapor deposition flow needs to be further improved, it is desirable that the limiting board 300 which limits passing of vapor deposition particles be provided between the mask 10 and the vapor deposition particle emitting device 30 so as to be in parallel with the mask 10 as shown in FIGS. 15 and 16.

The limiting board 300 is provided with a plurality of apertures 301 (through-holes) bored through the limiting board 300 in an up-and-down direction.

In a case where the limiting board 300 which limits passing of vapor deposition particles is thus provided between the mask 10 and the vapor deposition particle emitting device 30, it is possible to improve a film thickness distribution in a film pattern formed on a film formation target substrate 200.

Figure 16:
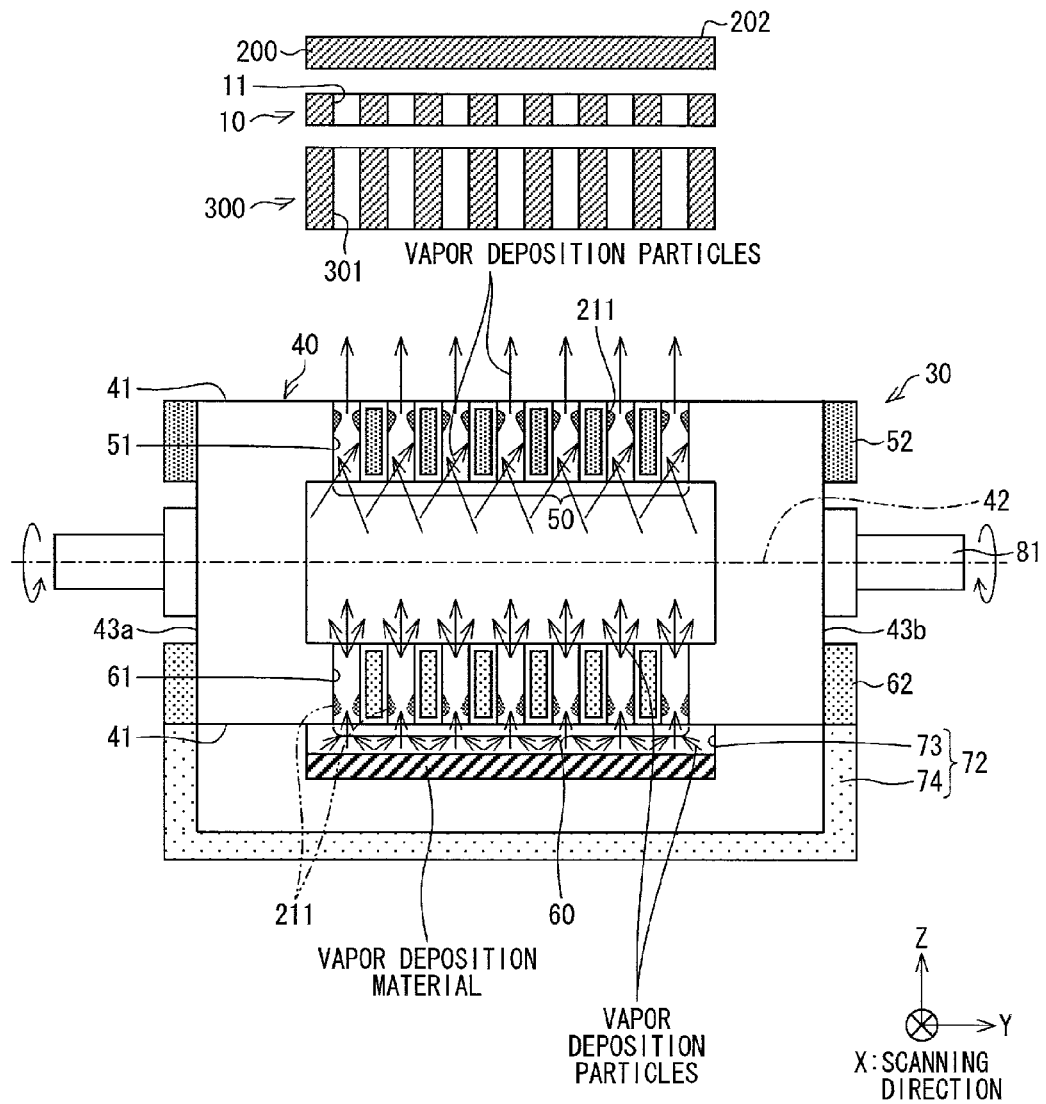
FIG. 16 is a cross-sectional view schematically showing a configuration of a main part of the vapor deposition apparatus according to Embodiment 4 of the present invention.

As shown in FIGS. 15 and 16, each of the apertures 301 of the limiting board 300 appears to correspond in center position to a corresponding one of the apertures of each nozzle section (in the example shown in FIGS. 15 and 16, the apertures 51 of the first nozzle section 50 and the apertures 61 of the second nozzle section 60) in the vapor deposition particle emitting device 30 with respect to the direction normal to the film formation target surface 201 of the film formation target substrate 200.

The shape of the apertures of each nozzle section (for example, the shape and size of the cooled nozzle sections serving as outward emission holes) in the vapor deposition particle emitting device 30 may be different from that of the apertures (the shape and size of the apertures 301) of the limiting board 300.

In a case where the center positions of the apertures 51, 61, and 301 are provided in an identical position as described above, the limiting board 300 can prevent spread of a vapor deposition flow with a high accuracy even if the vapor deposition flow from the cooled nozzle section slightly spreads. This makes it possible to improve a collimation characteristic of the vapor deposition flow.

Note that for simplification, apertures 11 in the mask 10 and the apertures in the limiting board 70 are identical in shape in FIG. 16. However, actually, a pattern formed by the apertures 11 in the mask 10 is finer than that formed by the apertures of the limiting board 300.

For example, though depending on a size of the film formation target substrate 200 and/or a film pattern to be formed, it is preferable to set an aperture size of each of the apertures 301 in the limiting board 300 in a direction parallel to a scanning direction (substrate carrying direction) to be equal to or smaller than 0.2 m.

However, the aperture size which is greater than 0.2 m merely causes more vapor deposition particles to be adhered on the mask 10. This merely results in an increase in vapor deposition particle component which does not contribute to film formation.

In contrast, in a case where each of the apertures 11 in the mask 10 in the direction parallel to the scanning direction (substrate carrying direction) is too large in aperture size, a pattern accuracy deteriorates.

Therefore, in order to secure the pattern accuracy, the aperture size of the mask 10 needs to be equal to or smaller than 20 cm at the current technical level.

Though depending on a size of the film formation target substrate 200 and/or a film pattern to be formed, it is preferable to set the aperture size of the limiting board 300 in a direction perpendicular to a scanning direction (substrate carrying direction) to be equal to or smaller than 5 cm. The aperture size which is larger than 5 cm causes problems such that (i) great unevenness in thickness of a vapor-deposited film occurs on the film formation target surface 201 of the film formation target substrate 200 and (ii) an amount of difference between a pattern of the mask 10 and a formed pattern becomes too large.

A position of the limiting board 300 in a direction perpendicular to the film formation target surface 201 of the film formation target substrate 200 is not specifically limited provided that the limiting board 300 is provided between the mask 10 and the vapor deposition particle emitting device 30 so as to be apart from the vapor deposition particle emitting device 30. For example, the limiting board 300 may be provided so as to be in contact with the mask 10.

Note that the limiting board 300 is provided so as to be apart from the vapor deposition particle emitting device 30 for the following reasons.

In order to block vapor deposition particles containing an oblique-flow component, the limiting board 300 is not heated, or is cooled by a heat exchanger (not illustrated). Therefore, the limiting board 300 has a temperature lower than a temperature of the emission holes of the vapor deposition particle emitting device 30.

Further, in order to prevent vapor deposition particles from travelling in a direction toward the film formation target substrate 200, it is necessary to provide a shutter (not illustrated) between the limiting board 300 and the vapor deposition particle emitting device 30. Therefore, a distance equal to or longer than 2 cm needs to be provided between the limiting board 300 and the vapor deposition particle emitting device 30.

<Experimental Comparison of Formed Film Patterns>

Figure 17:
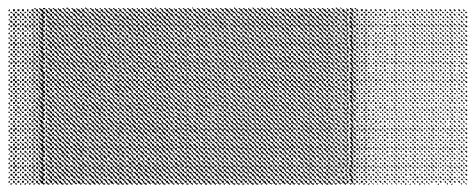
FIG. 17 is a diagram showing an optical micrograph of a formed film pattern obtained by using the vapor deposition apparatus according to Embodiment 4 of the present invention.

Next, for comparison, FIG. 17 shows a result obtained by actually forming a film pattern by using the vapor deposition apparatus 1 having the configurations shown in FIGS. 15 and 16.

FIG. 17 is a diagram showing an optical micrograph of a formed film pattern obtained by using the vapor deposition apparatus 1 according to Embodiment 4.

Note that, a condition used in an experiment here was identical to the condition used in <Experimental Comparison of Formed Film Patterns> of Embodiment 1, except that the limiting board 300 was provided between the mask 10 and the vapor deposition particle emitting device 30 (described earlier) as a vapor deposition source and that a distance between the limiting board 300 and the vapor deposition particle emitting device 30 and a distance between the limiting board 300 and the mask 10 were each set to 5 cm in the direction perpendicular to the film formation target surface 201 of the film formation target substrate 200.

As shown in FIG. 17, Embodiment 4 makes it possible to obtain a formed film pattern in which a pattern blur is further suppressed than in the case of Embodiment 1 and almost no pattern blur occurs.

This reveals that Embodiment 4 makes it possible to form a higher-definition display panel. Further, a result of the above experiment reveals that according to Embodiment 3, provision of the limiting board 300 between the mask 10 and the vapor deposition particle emitting device 30 makes it possible to further prevent spread of a vapor deposition flow and to further improve a collimation characteristic of the vapor deposition flow.

<Modification>

Figure 18:
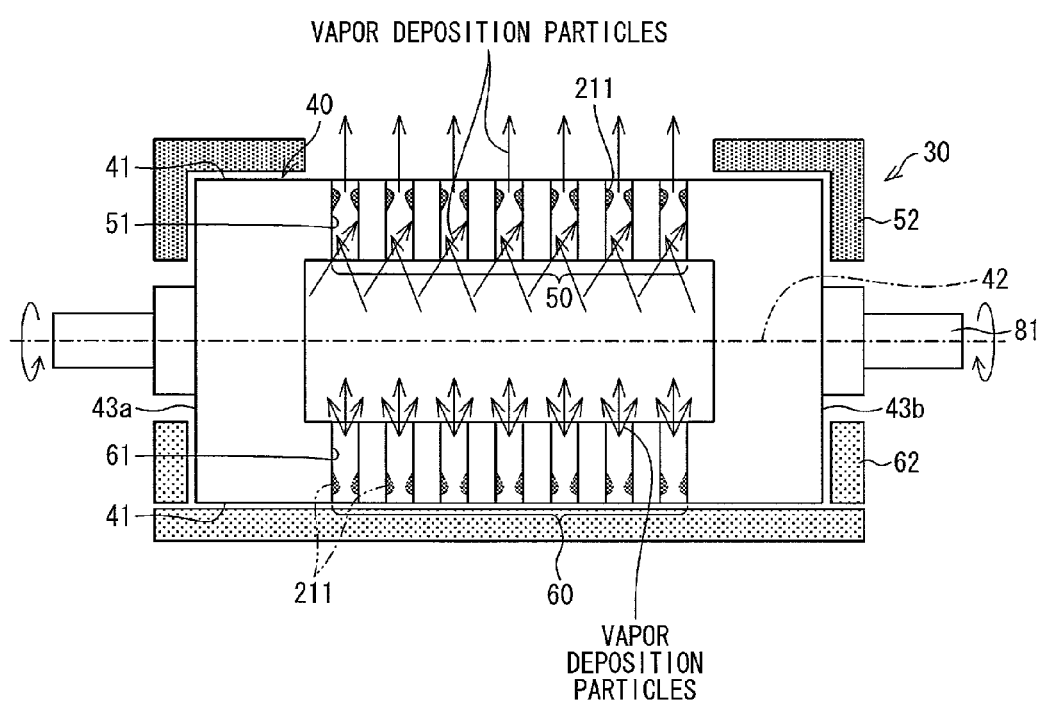
FIG. 18 is a cross-sectional view showing a modification of a vapor deposition particle emitting device according to the present invention.
Figure 19:
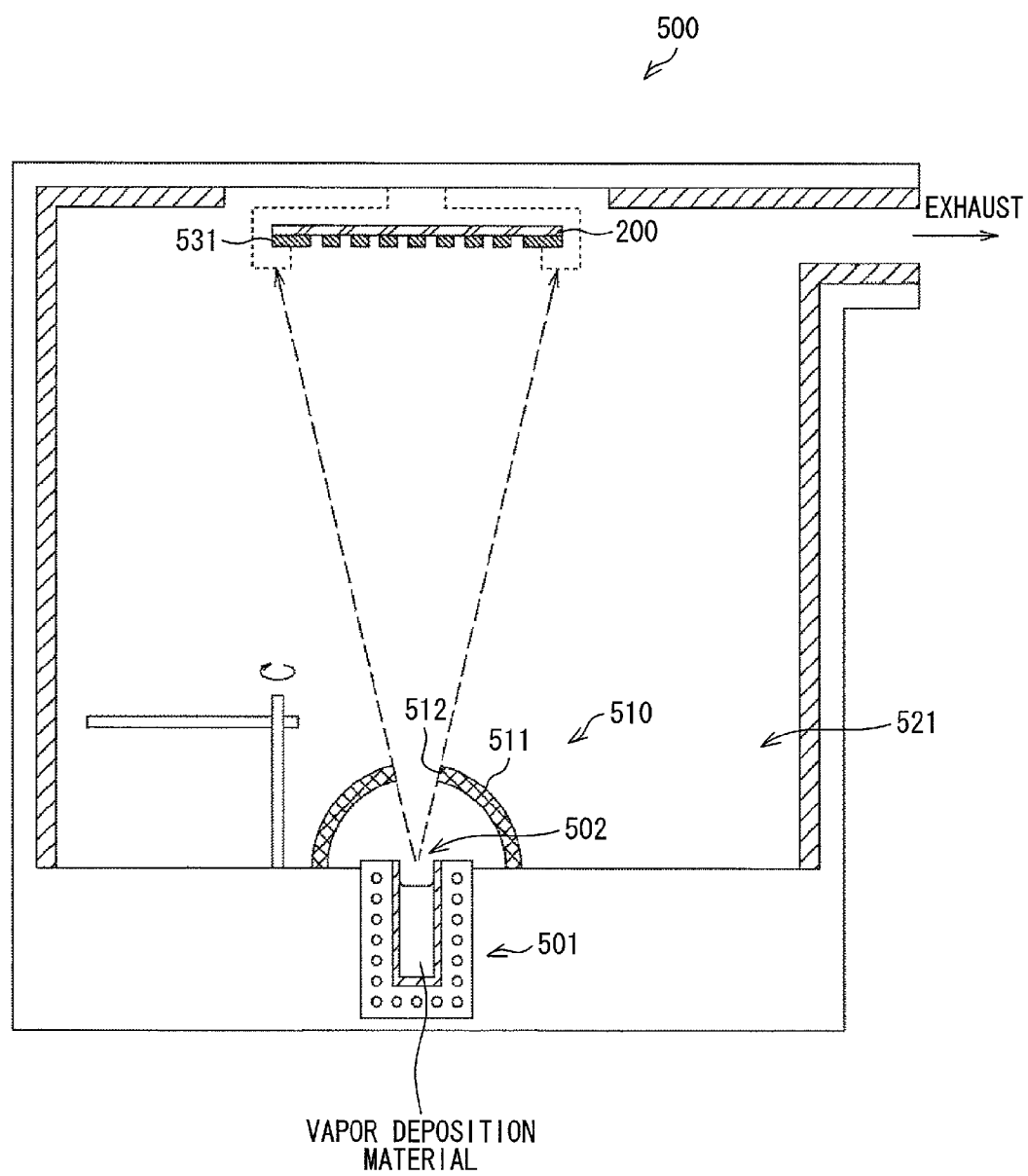
FIG. 19 is a cross-sectional view schematically showing a vacuum vapor deposition apparatus as described in Patent Literature 1.

FIG. 18 is a cross-sectional view showing a modification of the vapor deposition particle emitting device 30. FIG. 18 omits to illustrate the vapor deposition particle leakage prevention member 70.

Embodiments 1 to 4 have each been described by taking, as an example, a case where a crucible section 72 is provided as a vapor deposition particle generating section for supplying vapor deposition particles to the rotor 40.

As shown in FIG. 18, however, the crucible section 72 is not necessarily required.

Further, Embodiments 1 to 4 have each been described by taking, as an example, a case where the heat exchangers 52 and 62 are each provided integrally with the rotor 40 in correspondence with a nozzle section. The present invention is, however, not limited to such a configuration.

That is, of a nozzle section pair, the nozzle section facing outward is used as a cooled nozzle section, whereas the nozzle section paired with the above nozzle section is used as a heated nozzle section.

Thus, in a case where as shown in FIG. 18, (i) the rotor 40 is provided with a single cylindrical tube and (ii) the cooled nozzle section and the heated nozzle section are each single-tiered, the vapor deposition particle leakage prevention member 70 may be provided with heat exchangers 52 and 62 each in correspondence with a nozzle section of the rotor 40 so that the nozzle section serving as outward emission holes is cooled by one of the heat exchangers (the heat exchanger 52) and that the other nozzle section is heated by the heat exchanger 62.

In other words, the heat exchangers 52 and 62 may be provided separately from the rotor 40.

The foregoing configuration in which the vapor deposition particle emitting device 30 is provided with a crucible section 72 as a vapor deposition particle generating section may be replaced by, for example, the configuration in which the vapor deposition particle leakage prevention member 70 is provided with a load lock pipe (not illustrated) and the vapor deposition material in a gas phase is supplied, by use of the load lock pipe heated, to the vapor deposition particle generating section from a vapor deposition material container (not illustrated) such as a tank which is provided outside the vacuum chamber and which uses a heating mechanism.

<Down Deposition>

Embodiments 1 to 4 have discussed, as an example, a case where in a state in which the vapor deposition particle emitting device 30 is provided below the film formation target substrate 200, the vapor deposition particle emitting device 30 carries out up deposition of the vapor deposition particles through the apertures 11 in the mask 10 by causing the vapor deposition particles to flow upward from below (described earlier). However, the present invention is not limited to such an example.

For example, Embodiment 1 may also be configured such that in a state in which the vapor deposition particle emitting device 30 is provided above the film formation target substrate 200 by changing an arrangement of the substrate moving unit 3, the mask moving unit 4, the shutter operation unit 5, and the vapor deposition particle emitting device shifting unit 20 as shown in FIG. 1 (for example, turning the arrangement shown in FIG. 1 upside down), the vapor deposition particle emitting device 30 carries out vapor deposition (down deposition) of the vapor deposition particles through the apertures 11 in the mask 10 by causing the vapor deposition particles to flow downward from above.

Note that, in a case where down deposition is carried out as described above, for example, instead of directly containing the vapor deposition material in the recess 73 in the vapor deposition particle leakage prevention member 70 and heating the vapor deposition material, the vapor deposition particle leakage prevention member 70 should be provided with, for example, a load lock pipe so that through the load lock pipe, the vapor deposition material evaporated or sublimated is emitted (described earlier).

In a case where vapor deposition is carried out by down deposition in this way, a high-definition pattern can be formed with a high accuracy all over the film formation target substrate 200 even if no method such as an electrostatic chuck is used to suppress bending of the film formation target substrate 200 by self weight.

<Side Deposition>

Alternatively, the vapor deposition particle emitting device 30 may be configured to include, for example, a mechanism that injects the vapor deposition particles in a transverse direction. Then, the vapor deposition particle emitting device 30 may carry out vapor deposition (side deposition) of the vapor deposition particles in the transverse direction through the mask 10 onto the film formation target substrate 200 in a state in which the film formation target surface 201 of the film formation target substrate 200 stands upright so as to face the vapor deposition particle emitting device 30.

Note that, also in a case where side deposition is carried out as described above, for example, instead of directly containing the vapor deposition material in the recess 73 in the vapor deposition particle leakage prevention member 70 and heating the vapor deposition material, the vapor deposition particle leakage prevention member 70 should be provided with, for example, a load lock pipe so that through the load lock pipe, the vapor deposition material evaporated or sublimated are emitted.

<Outline of the Main Points>

A vapor deposition particle emitting device according to each of the embodiments described above is a vapor deposition particle emitting device, the vapor deposition particle emitting device including a vapor deposition particle generating section which generates a gas of vapor deposition particles by heating a vapor deposition material, for turning the vapor deposition material into the gas of vapor deposition particles by heating the vapor deposition material and for emitting the vapor deposition particles outward, including: (1) a rotor which is hollow, the rotor being provided with at least one pair of nozzle sections each having a plurality of through-holes through which the vapor deposition particles are emitted, the at least one pair of nozzle sections symmetrically facing each other in a direction in which the thorough-holes extend; (2) a rolling mechanism which causes the rotor to rotate so that the pair of nozzle sections swap their places with each other; and (3) a plurality of temperature adjustment members provided for each separate one of the nozzle sections, the rolling mechanism causing one of the nozzle sections of the rotor to be held to face outward, the nozzle section facing outward being cooled by its corresponding temperature adjustment member to a temperature lower than a temperature at which the vapor deposition material turns into the gas, the nozzle section paired with the nozzle section facing outward being heated by its corresponding temperature adjustment member to a temperature equal to or higher than the temperature at which the vapor deposition material turns into the gas, when the rolling mechanism causes the rotor to rotate, the temperature adjustment members switching between cooling and heating in accordance with placement of the nozzle sections.

In the above configuration, the through-holes in the nozzle section that face outward, which are used as emission holes through which vapor deposition particle flow out, are set at a temperature that is lower than a temperature at which the vapor deposition material turns into gas, as described above. This makes it possible to block an oblique-flow component of a vapor deposition flow. Therefore, collimation of the vapor deposition flow by a physical length (nozzle length) of each through-hole in the nozzle section becomes possible.

Further, by causing the cooled nozzle section and the heated nozzle section to replace each other through an operation of rotation of the rotor by the rolling mechanism and gasifying (re-evaporating or re-sublimating) the adhering substance having adhered to the nozzle wall surfaces by heating the adhering substance, clogging of the nozzle sections can be eliminated without carrying out special work of taking the vapor deposition particle emitting device out of the film formation chamber, disassemble it, or carrying out maintenance on it. Further, since the adhering substance can be reused as a vapor deposition material, the efficiency in the use of material can be dramatically increased.

This eliminates the need to separately provide a cover member for recovering the vapor deposition material as in Patent Literature 1 and makes it possible to recover and reuse the vapor deposition material without taking it out of the apparatus.

Furthermore, the vapor deposition flow can be collimated as described above. This makes it possible to suppress blurring of a formed film pattern and to produce a high display quality panel.

The vapor deposition particle emitting device is preferably configured such that the at least one pair of nozzle sections of the rotor comprises a plurality of pairs of nozzle sections, the plurality of pairs of nozzle sections being placed at a predetermined interval along a direction of rotation about an axis of rotation of the rotor.

With this configuration, in which a plurality of pairs of nozzle sections are provided around the axis of rotation (center of rotation) of the rotor, while one pair of nozzle sections are in use, the other pairs of nozzle sections can each change its temperature.

The foregoing configuration can thus reduce the time necessary for the cooled nozzle section and the heated nozzle section to each have a stable temperature after the rolling mechanism finishes an operation of causing the rotor to rotate.

Further, the vapor deposition particle emitting device is preferably configured such that each of the paired nozzle sections includes multi-tiered nozzle sections placed at a predetermined interval along the direction in which the through-holes extend.

The foregoing configuration, in which both the cooled nozzle sections and the heated nozzle section have a multiple-tiered structure, can improve a collimation characteristic of the vapor deposition flow.

Providing multi-tiered cooled nozzle sections as described above can increase a tolerable amount of the adhering substance having adhered to the cooled nozzle sections.

This allows a longer interval between instances of replacement of the cooled nozzle sections and the heated nozzle sections with each other.

Further, the vapor deposition particle emitting device is preferably configured such that the multi-tiered nozzle sections have their temperatures controlled so that an outer one of the nozzle sections is lower in temperature than an inner one of the nozzle sections.

Further, the vapor deposition particle emitting device is preferably configured such that the nozzle section paired with the nozzle section facing outward is heated by its corresponding temperature adjustment member to a temperature equal to or hither than the temperature at which the vapor deposition material turns into the gas and lower than a temperature of the vapor deposition particle generating section.

When a temperature of a vapor deposition flow (vapor flow) is lowered at once by lowering a temperature of the through-holes at once in the cooled nozzle section, the vapor deposition particles tend to be deposited on wall surfaces (nozzle wall surfaces) of the through-holes.

Since the plurality of nozzle sections have their temperatures controlled so that an outer one of the nozzle sections is lower in temperature than an inner one of the nozzle sections, the temperature of vapor deposition particles in a path through which the vapor deposition particles are released (emitted) can be lowered stepwise while re-evaporating or re-sublimating the adhering substance.

Further, by adjusting and controlling the nozzle section paired with the nozzle section facing outward, i.e., the nozzle section used as the heated nozzle section to a temperature equal to or higher than the temperature at which the vapor deposition material turns into gas and lower than the temperature of the vapor deposition particle generating section, the temperature of vapor deposition particles in a path through which the vapor deposition particles are released (emitted) can be lowered stepwise while re-evaporating or re-sublimating the adhering substance.

Each of the configurations described above makes it possible to reduce the amount of the vapor deposition material that adheres to the wall surfaces of the nozzle sections within unit time. At the same time, a pressure in the cooled nozzle section and an area therearound can be locally reduced. This allows a further improvement in collimation characteristic of a vapor deposition flow.

This makes it possible to further lengthen an interval between timings at which the cooled nozzle section and the heated nozzle section replace each other, and also makes it possible to further suppress blurring of a formed film pattern and to produce a higher display quality panel.

The vapor deposition particle emitting device is preferably configured to further include a parameter detecting section which detects a parameter for determining a timing at which the pair of nozzle sections swap their places with each other, wherein the rolling mechanism causes, in accordance with a signal sent from the parameter detecting section, the pair of nozzle sections to swap their places with each other when the parameter detected by the parameter detecting section has reached a preset condition.

In this case, for example, the vapor deposition particle emitting device can be configured such that: the parameter detecting section is an image sensor including (i) an imaging section and (ii) a calculating section which, by analyzing an image sent from the imaging section, calculates a proportion of (a) an adhering substance having adhered to the nozzle section facing outward to (ii) an aperture area of the nozzle section facing outward; and the rolling mechanism causes the pair of nozzle sections to swap their places with each other when the proportion calculated by the calculating section has reached a preset threshold.

Alternatively, the vapor deposition particle emitting device may be configured such that: the parameter detecting section includes (i) a timer section which measures operating time during which the vapor deposition particle emitting device operates and (ii) a calculating section which accumulates the operating time measured by the timer section; and the rolling mechanism causes the pair of nozzle sections to swap their places with each other when the accumulated operating time calculated by the calculating section has reached a designated time.

Alternatively, the vapor deposition particle emitting device may be configured such that: the parameter detecting section is a counter which counts a number of times films are formed by the vapor deposition particles emitted; and the rolling mechanism causes the pair of nozzle sections to swap their places with each other when the number of times counted by the counter has reached a designated number of times.

Alternatively, the vapor deposition particle emitting device may be configured such that: the parameter detecting section includes (i) light irradiation means for irradiating, with light, the adhering substance having adhered to the nozzle section facing outward, (ii) a detecting section which detects an intensity of reflection of or a spectrum of reflected light obtained by irradiating the adhering substance with light, and (iii) a calculating section which calculates an amount of the adhering substance from the intensity of reflection or the spectrum detected by the detecting section; and the rolling mechanism causes the pair of nozzle sections to swap their places with each other when the amount has reached a preset threshold.

A vapor deposition apparatus according to each of the embodiments described above is a vapor deposition apparatus for forming a film in a predetermined pattern on a film formation target substrate, the vapor deposition apparatus including: (1) the vapor deposition particle emitting device; (2) a vapor deposition mask including through holes, the vapor deposition mask allowing the vapor deposition particles emitted from the vapor deposition particle emitting device to pass through the through holes so that the vapor deposition particles are vapor-deposited onto the film formation target substrate, the vapor deposition mask having an area that is smaller than an area of a vapor deposition target region of the film formation target substrate; and (3) moving means that moves at least either one of (i) the film formation target substrate and (ii) a combination of the vapor deposition particle emitting device and the vapor deposition mask relative to the other with the vapor deposition mask and the film-formed substrate kept apart at a constant distance from each other.

A vapor deposition method according to each of the embodiments described above is a vapor deposition method for forming a film in a predetermined pattern on a film formation target substrate by using the vapor deposition apparatus, the vapor deposition method including the steps of: (1) performing vapor deposition while moving at least either one of (i) the film formation target substrate and (ii) a combination of the vapor deposition particle emitting device and the vapor deposition mask relative to the other with the vapor deposition mask and the film-formed substrate kept apart at a constant distance from each other; and (2) by using the rolling mechanism to cause the rotor to rotate, causing a nozzle section facing outward and a nozzle section paired with the nozzle section to swap their places with each other and switching between cooling and heating.

In each of the above described configurations, the vapor deposition apparatus includes the vapor deposition particle emitting device. This can make (i) directions in which the vapor deposition particles travel from a position at which the vapor deposition particles have been emitted from the vapor deposition particle emitting device to a position at which the vapor deposition particles reaches the vapor deposition mask be parallel to (ii) the normal direction with respect to the film formation target surface of the film formation target substrate.

Therefore, in each of the above described configurations, the vapor deposition particles that travel in a direction that is perpendicular to the mask surface of the vapor deposition mask pass through the through holes in the vapor deposition mask and then adhere to the film formation target substrate in conformity with a mask pattern. This makes it possible to eliminate blurring of a formed film pattern and therefore to form a film pattern with a high accuracy.

Further, the inclusion of the vapor deposition particle emitting device in the vapor deposition apparatus makes it possible to eliminate clogging of the nozzle sections without carrying out special work of taking the vapor deposition particle emitting device out of the film formation chamber, disassemble it, or carrying out maintenance on it. This makes it possible to recover and reuse the vapor deposition material without taking it out of the apparatus.

Further, since the adhering substance can be reused as a vapor deposition material, the efficiency in the use of material can be dramatically increased.

This makes it possible to suppress blurring of a formed film pattern and to inexpensively produce a high display quality panel.

Further, the vapor deposition apparatus is preferably configured to further include a limiting board, provided between the vapor deposition particle emitting device and the vapor deposition mask, for limiting passage of the vapor deposition particles.

As described above, the limiting board is provided between the vapor deposition particle emitting device and the vapor deposition mask. This makes it possible to prevent spread of a vapor deposition flow and to further improve a collimation characteristic of the vapor deposition flow.

Further, the film in the predetermined pattern can be made of an organic layer in an organic electroluminescent element. The above vapor deposition apparatus can be suitably used as a device for producing an organic electroluminescent element. That is, the vapor deposition apparatus may be a device for producing an organic electroluminescent element.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The vapor deposition particle emitting device, vapor deposition apparatus and vapor deposition method of the present invention are suitably applicable to, for example, a device and method for producing an organic EL display device which are used in a film formation process of, for example, formation of an organic layer by selective vapor deposition in an organic EL display device.

REFERENCE SIGNS LIST

1 Vapor deposition apparatus
2 Vacuum chamber
2a Inner wall
3 Substrate moving unit (moving means)
4 Mask moving unit (moving means)
5 Shutter operation unit
6 Holder
7 Shutter
8 Projecting section
8a First projecting section
8b Second projecting section
8c Third projecting section
9 Opening
9a First opening
9b Second opening
9c Third opening
10 Mask (vapor deposition mask)
10a Long side
10b Short side
11 Aperture (through-hole)
20 Vapor deposition particle emitting device shifting unit
21 Stage
22 Actuator
30 Vapor deposition particle emitting device
40 Rotor
40a Outer tube
40b Inner tube
40c Cap section
41 Circumferential surface
42 Cylindrical axis (axis of rotation, center of rotation)
43a, 43b End face
44 Trap
50 First nozzle section
50a, 50b, 60a, 60b Nozzle section 51 Aperture (through-hole)
51a, 51b Aperture (through-hole)
52 Heat exchanger (temperature adjustment member)
52a, 52b Heat exchanger (temperature adjustment member)
55 Third nozzle section
55a, 55b Nozzle section
56 Aperture (through-hole)
57 Heat exchanger (temperature adjustment member)
57a, 57b Heat exchanger (temperature adjustment member)
60 Second nozzle section
60a, 60b Nozzle section (through-hole)
61 Aperture (through-hole)
61a, 61b Aperture (through-hole)
62 Heat exchanger (temperature adjustment member)
62a, 62b Heat exchanger (temperature adjustment member)
65 Fourth nozzle section
65a, 65b Nozzle section
66 Aperture (through-hole)
66a, 66b Aperture (through-hole)
67 Heat exchanger (temperature adjustment member)
67a, 67b Heat exchanger (temperature adjustment member)
70 Vapor deposition particle leakage prevention member
71 Opening
72 Crucible section (vapor deposition particle generating section)
73 Recess
74 Heat exchanger
80 Rolling mechanism
81 Rotating shaft
82 Rotary drive section
83 Rotary drive control section
84 Actuator
85 Retaining section
90 Parameter detecting section
91, 92 Nozzle section
100 Organic EL display device
101R, 101G, 101B Pixel
110 TFT substrate
111 Insulating substrate
112 TFT
113 Wire
114 Interlayer insulating film
114a Contact hole
115 Edge cover
120 Organic EL element
121 First electrode
122 Hole injection layer/hole transfer layer
123R, 123G, 123B Luminescent layer
124 Electron transfer layer
125 Electron injection layer
126 Second electrode
130 Adhesive layer
140 Sealing substrate
200 Film formation target substrate
200a Long side
201 Film formation target surface
202 Non-film-formation-target surface
211 Adhering substance
300 Limiting board
301 Aperture (through-hole)

The invention claimed is:

1. A vapor deposition particle emitting device, including a vapor deposition particle generating section which generates a gas of vapor deposition particles by heating a vapor deposition material, for turning the vapor deposition material into the gas of vapor deposition particles by heating the vapor deposition material and for emitting the vapor deposition particles outward, the vapor deposition particle emitting device comprising:
   a rotor which is hollow, the rotor being provided with at least one pair of nozzle sections each having a plurality of through-holes through which the vapor deposition particles are emitted, the at least one pair of nozzle sections symmetrically facing each other in a direction in which the thorough-holes extend;
   a rolling mechanism which causes the rotor to rotate so that the pair of nozzle sections swap their places with each other; and
   a plurality of temperature adjustment members provided for each separate one of the nozzle sections,
   the rolling mechanism causing one of the nozzle sections of the rotor to be held to face outward,
   the nozzle section facing outward being cooled by its corresponding temperature adjustment member to a temperature lower than a temperature at which the vapor deposition material turns into the gas,
   the nozzle section paired with the nozzle section facing outward being heated by its corresponding temperature adjustment member to a temperature equal to or higher than the temperature at which the vapor deposition material turns into the gas,
   when the rolling mechanism causes the rotor to rotate, the temperature adjustment members switching between cooling and heating in accordance with placement of the nozzle sections.

2. The vapor deposition particle emitting device as set forth in claim 1, wherein the at least one pair of nozzle sections of the rotor comprises a plurality of pairs of nozzle sections, the plurality of pairs of nozzle sections being placed at a predetermined interval along a direction of rotation about an axis of rotation of the rotor.

3. The vapor deposition particle emitting device as set forth in claim 1, wherein each of the paired nozzle sections includes multi-tiered nozzle sections placed at a predetermined interval along the direction in which the through-holes extend.

4. The vapor deposition particle emitting device as set forth in claim 3, wherein the multi-tiered nozzle sections have their temperatures controlled so that an outer one of the nozzle sections is lower in temperature than an inner one of the nozzle sections.

5. The vapor deposition particle emitting device as set forth in claim 1, wherein the nozzle section paired with the nozzle section facing outward is heated by its corresponding temperature adjustment member to a temperature equal to or hither than the temperature at which the vapor deposition material turns into the gas and lower than a temperature of the vapor deposition particle generating section.

6. The vapor deposition particle emitting device as set forth in claim 1, further comprising a parameter detecting section which detects a parameter for determining a timing at which the pair of nozzle sections swap their places with each other, wherein
   the rolling mechanism causes, in accordance with a signal sent from the parameter detecting section, the pair of nozzle sections to swap their places with each other when the parameter detected by the parameter detecting section has reached a preset condition.

7. The vapor deposition particle emitting device as set forth in claim 6, wherein:

the parameter detecting section is an image sensor including (i) an imaging section and (ii) a calculating section which, by analyzing an image sent from the imaging section, calculates a proportion of (a) an adhering substance having adhered to the nozzle section facing outward to (ii) an aperture area of the nozzle section facing outward; and the rolling mechanism causes the pair of nozzle sections to swap their places with each other when the proportion calculated by the calculating section has reached a preset threshold.

8. The vapor deposition particle emitting device as set forth in claim 6, wherein:

the parameter detecting section includes (i) a timer section which measures operating time during which the vapor deposition particle emitting device operates and (ii) a calculating section which accumulates the operating time measured by the timer section; and the rolling mechanism causes the pair of nozzle sections to swap their places with each other when the accumulated operating time calculated by the calculating section has reached a designated time.

9. The vapor deposition particle emitting device as set forth in claim 6, wherein:

the parameter detecting section is a counter which counts a number of times films are formed by the vapor deposition particles emitted; and the rolling mechanism causes the pair of nozzle sections to swap their places with each other when the number of times counted by the counter has reached a designated number of times.

10. The vapor deposition particle emitting device as set forth in claim 6, wherein:

the parameter detecting section includes (i) light irradiation means for irradiating, with light, the adhering substance having adhered to the nozzle section facing outward, (ii) a detecting section which detects an intensity of reflection of or a spectrum of reflected light obtained by irradiating the adhering substance with light, and (iii) a calculating section which calculates an amount of the adhering substance from the intensity of reflection or the spectrum detected by the detecting section; and the rolling mechanism causes the pair of nozzle sections to swap their places with each other when the amount has reached a preset threshold.

11. A vapor deposition apparatus for forming a film in a predetermined pattern on a film formation target substrate, the vapor deposition apparatus comprising:

a vapor deposition particle emitting device as set forth in claim 1;

a vapor deposition mask including through-holes, the vapor deposition mask allowing the vapor deposition particles emitted from the vapor deposition particle emitting device to pass through the through-holes so that the vapor deposition particles are vapor-deposited onto the film formation target substrate, the vapor deposition mask having an area that is smaller than an area of a vapor deposition target region of the film formation target substrate; and moving means that moves at least either one of (i) the film formation target substrate and (ii) a combination of the vapor deposition particle emitting device and the vapor deposition mask relative to the other with the vapor deposition mask and the film-formed substrate are kept apart at a constant distance from each other.

12. The vapor deposition apparatus as set forth in claim 11, further comprising a limiting board, provided between the vapor deposition particle emitting device and the vapor deposition mask, for limiting passage of the vapor deposition particles.

13. The vapor deposition apparatus as set forth in claim 11, wherein the film in the predetermined pattern is made of an organic layer in an organic electroluminescent element.

14. A vapor deposition method for forming a film in a predetermined pattern on a film formation target substrate by using a vapor deposition apparatus as set forth in claim 11, the vapor deposition method comprising the steps of:

(1) performing vapor deposition while moving at least either one of (i) the film formation target substrate and (ii) a combination of the vapor deposition particle emitting device and the vapor deposition mask relative to the other with the vapor deposition mask and the film-formed substrate kept apart at a constant distance from each other; and (2) by using the rolling mechanism to cause the rotor to rotate, causing a nozzle section facing outward and a nozzle section paired with the nozzle section to swap their places with each other and switching between cooling and heating.

* * * * *